(12) United States Patent
Woelk

(10) Patent No.: US 12,104,252 B2
(45) Date of Patent: *Oct. 1, 2024

(54) METHOD AND APPARATUS FOR MAKING A VAPOR OF PRECISE CONCENTRATION BY SUBLIMATION

(71) Applicant: CeeVeeTech, LLC, Peabody, MA (US)

(72) Inventor: Egbert G. Woelk, North Andover, MA (US)

(73) Assignee: CeeVee Tech, LLC, Peabody, MA (US)

( * ) Notice: Subject to any disclaimer, the term of this patent is extended or adjusted under 35 U.S.C. 154(b) by 187 days.

This patent is subject to a terminal disclaimer.

(21) Appl. No.: 17/493,278

(22) Filed: Oct. 4, 2021

(65) Prior Publication Data

US 2022/0042174 A1   Feb. 10, 2022

Related U.S. Application Data

(63) Continuation-in-part of application No. 17/227,695, filed on Apr. 12, 2021, and a continuation-in-part of
(Continued)

(51) Int. Cl.
  *C23C 16/448*   (2006.01)
  *C23C 16/52*    (2006.01)
  *C23C 16/455*   (2006.01)

(52) U.S. Cl.
  CPC .......... *C23C 16/52* (2013.01); *C23C 16/4481* (2013.01); *C23C 16/45506* (2013.01)

(58) Field of Classification Search
  CPC ..... C23C 16/4481; C23C 16/46; C23C 16/52; C23C 16/448; C23C 18/1283
(Continued)

(56) References Cited

U.S. PATENT DOCUMENTS 4,400,309 A   8/1983   McMahon et al.
5,377,429 A   1/1995   Sandhu et al.
(Continued)

FOREIGN PATENT DOCUMENTS

EP   1747302 B1    12/2002
JP   2008-522022 A  6/2008
(Continued)

OTHER PUBLICATIONS

Japan Patent Office, Notification of Reasons of Refusal, Application No. 2020-544229, dated Apr. 4, 2023, 7 pages.
(Continued)

*Primary Examiner* — Aiden Lee
(74) *Attorney, Agent, or Firm* — Sunstein LLP

(57) ABSTRACT

Techniques for controlling a solid precursor vapor source are provided. An example method of controlling a solid precursor vapor source includes providing a carrier gas to a sublimation vessel containing a solid precursor material, wherein the carrier gas is heated with a carrier gas temperature control device prior to entering the sublimation vessel, measuring a temperature of a vapor exiting the sublimation vessel, and controlling a temperature of the carrier gas with the carrier gas temperature control device based at least in part on the temperature of the vapor exiting the sublimation vessel.

10 Claims, 13 Drawing Sheets

Related U.S. Application Data application No. 16/260,378, filed on Jan. 29, 2019, now Pat. No. 11,168,394.

(60) Provisional application No. 62/642,982, filed on Mar. 14, 2018.

(58) Field of Classification Search
USPC .......................................................... 118/726
See application file for complete search history.

(56) References Cited

U.S. PATENT DOCUMENTS

| | | | |
|---|---|---|---|
| 5,553,395 A | 9/1996 | Wen et al. | |
| 5,764,849 A | 6/1998 | Atwell | |
| 6,161,398 A | 12/2000 | Partus | |
| 6,270,839 B1 | 8/2001 | Onoe et al. | |
| 6,482,266 B1* | 11/2002 | Matsumoto | C23C 16/409 |
| | | | 118/712 |
| 6,772,072 B2 | 8/2004 | Ganguli et al. | |
| 6,797,337 B2 | 9/2004 | Dando et al. | |
| 6,839,505 B2 | 1/2005 | Sandhu | |
| 6,878,183 B2 | 4/2005 | Soeda et al. | |
| 6,984,415 B2 | 1/2006 | McFeely et al. | |
| 7,122,085 B2 | 10/2006 | Shero et al. | |
| 7,428,373 B2 | 9/2008 | Sandhu | |
| 7,651,570 B2 | 1/2010 | Breka | |
| 7,695,565 B2 | 4/2010 | Kordina | |
| 8,029,621 B2 | 10/2011 | Yamasaki et al. | |
| 8,170,404 B2 | 5/2012 | Tran et al. | |
| 8,197,898 B2 | 6/2012 | Leusink | |
| 8,277,887 B2 | 10/2012 | Shenai-Khatkhate | |
| 8,309,173 B2 | 11/2012 | Tuominen et al. | |
| 8,343,583 B2 | 1/2013 | Snijders et al. | |
| 8,821,640 B2 | 9/2014 | Cleary et al. | |
| 8,887,650 B2 | 11/2014 | Arena et al. | |
| 9,034,105 B2 | 5/2015 | Chaubey et al. | |
| 9,132,447 B2 | 9/2015 | Forrest et al. | |
| 9,869,018 B2 | 1/2018 | Lee et al. | |
| 2003/0030010 A1 | 2/2003 | Perel et al. | |
| 2003/0072875 A1 | 4/2003 | Sandhu | |
| 2004/0015300 A1 | 1/2004 | Ganguli et al. | |
| 2005/0011443 A1 | 1/2005 | Matsukaze et al. | |
| 2008/0268143 A1* | 10/2008 | Vahlas | B01D 3/346 |
| | | | 118/733 |
| 2010/0126417 A1 | 5/2010 | Hasegawa et al. | |
| 2011/0091821 A1 | 4/2011 | Kobayashi | |
| 2012/0103249 A1 | 5/2012 | Gupta et al. | |
| 2013/0089934 A1 | 4/2013 | Liu et al. | |
| 2019/0134586 A1* | 5/2019 | Nakagawa | C23C 16/52 |

FOREIGN PATENT DOCUMENTS

| | | |
|---|---|---|
| JP | 2009-239297 A | 10/2009 |
| JP | 2009-267388 A | 11/2009 |
| JP | 2010-502833 A | 1/2010 |
| WO | 2013145834 A1 | 10/2013 |

OTHER PUBLICATIONS

European Patent Office, Extended European Search Report, Application No. 19767105.0, dated Nov. 5, 2021, 12 pages.

The State Intellectual Property Office of People's Republic of China, First Office Action, Application No. 201980014314.8, dated Feb. 23, 2022, 20 pages.

* cited by examiner

METHOD AND APPARATUS FOR MAKING A VAPOR OF PRECISE CONCENTRATION BY SUBLIMATION

CROSS-REFERENCE TO RELATED APPLICATIONS

This application is a continuation-in-part of U.S. patent application Ser. No. 16/260,378, filed on Jan. 29, 2019, entitled "METHOD AND APPARATUS FOR MAKING A VAPOR OF PRECISE CONCENTRATION BY SUBLIMATION," which claims the benefit of U.S. Provisional Application No. 62/642,982, filed Mar. 14, 2018, entitled "METHOD AND APPARATUS FOR MAKING A VAPOR OF PRECISE CONCENTRATION BY SUBLIMATION," and is a continuation-in-part of U.S. patent application Ser. No. 17/227,695, filed Apr. 12, 2021, entitled "METHOD AND APPARATUS FOR MAKING A VAPOR OF PRECISE CONCENTRATION BY SUBLIMATION," which claims the benefit of U.S. Provisional Application No. 62/642,982, filed Mar. 14, 2018, entitled "METHOD AND APPARATUS FOR MAKING A VAPOR OF PRECISE CONCENTRATION BY SUBLIMATION," each of which is assigned to the assignee hereof, of which the entire contents are hereby incorporated herein by reference for all purposes.

BACKGROUND

A chemical vapor deposition (CVD) process generally depends on the controlled evaporation of a liquid or solid precursor. Suitable liquid and solid precursors have a reasonably high vapor pressure. The vapor of the precursor is transported in a carrier gas to the process chamber where the precursor reacts on the surface of a substrate to form a material film. For nearly all processes the delivery rate of the precursor (in grams per second, for example) needs to be precisely controlled in order to make the desired material film. The evaporation determines the delivery rate. Thus, the control of the evaporation or sublimation (in case of a solid) is critical for the CVD process to produce the desired material film.

SUMMARY

An example of a solid precursor vapor source according to the disclosure includes a sublimation vessel configured to contain a bed of a precursor material, such that the sublimation vessel includes one or more thermally insulated exterior walls, an inlet port disposed at a first side of the bed of the precursor material and configured to enable a flow of a carrier gas into the sublimation vessel, a first sublimation vessel temperature control device disposed proximate to the inlet port and configured to control a temperature of the carrier gas entering the sublimation vessel, an outlet port disposed at a second side of the bed of the precursor material and configured to enabled a flow of an entrained vapor to exit the sublimation vessel, such that the entrained vapor is generated by the carrier gas flowing through the bed of the precursor material from the first side to the second side, a second temperature control device disposed proximate to the outlet port and configured to control a temperature of the carrier gas and the entrained vapor exiting the sublimation vessel, a first temperature sensor disposed in the sublimation vessel proximate to the first side of the bed of the precursor material, a second temperature sensor disposed in the sublimation vessel proximate to the second side of the bed of the precursor material, a control computer operably coupled to the first temperature control device, the second temperature control device, the first temperature sensor and the second temperature sensor, and configured to control the first temperature control device based on a first temperature value sensed by the first temperature sensor, and control the second temperature control device based on a second temperature value sensed by the second temperature sensor, such that the second temperature value is approximately a sublimation temperature of the precursor material and the first temperature value is higher than the second temperature value.

Implementations of such a solid precursor vapor source may include one or more of the following features. A pressure controller may be operably coupled to the control computer, such that the pressure controller is disposed on the outlet port and is configured to measure and control a sublimation vessel pressure value. The control computer may be configured to control the first temperature control device such that the first temperature value is approximately equal to the sublimation temperature of the precursor material plus a delta temperature value, such that the delta temperature value is based at least in part on the sublimation vessel pressure value, a heat of sublimation value of the precursor material, and a specific heat at constant pressure (cp) value of the carrier gas. A mass flow controller may be operably coupled to the control computer and configured to control the flow of the carrier gas into the sublimation vessel. A carrier gas thermal device may be operably coupled to the control computer and disposed proximate to the inlet port of the sublimation vessel, such that the control computer is configured to control the carrier gas thermal device based at least in part on the first temperature value and the second temperature value. A temperature sensing tube may be disposed in the sublimation vessel, such that the first temperature sensor and the second temperature sensor are attached to the temperature sensing tube. A turbulator may be disposed in the sublimation vessel between the inlet port and the first side of the bed of the precursor material and configured to diffuse the carrier gas over the first side of the bed of the precursor material. The turbulator may be a plate comprising a plurality of structures extending outward from the plate. The first temperature control device and the second temperature control device may include a thermoelectric cooler and a resistive heater. The one or more thermally insulated exterior walls may be a thermally isolating shroud disposed around at least a portion of the sublimation vessel.

An example of a method for controlling a solid precursor vapor source according to the disclosure includes providing a carrier gas to a precursor material in a sublimation vessel, such that the sublimation vessel includes an inlet area and an outlet area configured to enable the carrier gas to flow through the precursor material, and at least one thermal device configured to add or remove heat from the sublimation vessel, determining a sublimation temperature value and a delta temperature value based on the precursor material and the carrier gas, setting a first temperature in the sublimation vessel based on the sublimation temperature value and the delta temperature value, such that the first temperature is measured proximate to the inlet area, and setting a second temperature in the sublimation vessel based on the sublimation temperature value, such that the second temperature is measured proximate to the outlet area.

Implementations of such a method may include one or more of the following features. The delta temperature value may be based on a heat of sublimation value of the precursor material, a specific heat at constant pressure (cp) value of the carrier gas, a vapor pressure value of the precursor material at the sublimation temperature value, and a sublimation vessel pressure value. Setting the first temperature and the second temperature may include setting a carrier gas thermal device temperature. Setting the first temperature and the second temperature may include setting an upstream thermal device temperature. Setting the second temperature may include setting a downstream thermal device. Determining the sublimation temperature value and the delta temperature value may include receiving the sublimation temperature value and the delta temperature value from a networked computer.

An example of a method of controlling a solid precursor vapor source according to the disclosure includes providing a carrier gas to a carrier gas thermal device configured to control a temperature of the carrier gas prior to entering a sublimation vessel, such that a pressure of the sublimation vessel is controlled by a pressure control device, providing the carrier gas to a precursor material in the sublimation vessel, such that the sublimation vessel includes an inlet area and an outlet area configured to enable the carrier gas to flow through the precursor material, measuring an inlet carrier gas temperature and an outlet carrier gas temperature for the carrier gas flowing through the respective inlet area and the outlet area of the sublimation vessel, determining a compensated sublimation vessel pressure value based at least in part on the outlet carrier gas temperature and a vapor pressure curve associated with the precursor material, determining a first delta temperature value based at least in part on the precursor material and the carrier gas and the compensated sublimation vessel pressure value, and providing a temperature control signal to the carrier gas thermal device based on a first delta temperature value and a pressure control signal to the pressure control device based at least in part on the inlet gas temperature, the outlet gas temperature, the nominal sublimation vessel pressure value, and a second delta temperature value.

Implementations of such a method may include one or more of the following features. Determining the compensated sublimation vessel pressure value may include receiving a nominal temperature value for a chemical vapor deposition process, receiving a nominal sublimation vessel pressure value for a chemical vapor deposition process, and determining the compensated sublimation vessel pressure based on a ratio of a vapor pressure value of the precursor material at the nominal temperature and the vapor pressure value of the precursor material at the outlet gas temperature. Determining the delta temperature value may include determining a ratio of a value of a vapor pressure of the precursor material at a sublimation temperature and the compensated sublimation vessel pressure value.

An example of a controller for a solid precursor vapor source includes a memory unit, at least one processor operably coupled to the memory unit and configured to receive a plurality of system values including a nominal sublimation temperature value, a cp value for a carrier gas, a heat of sublimation value for a precursor material, the parameter values for a vapor pressure curve for the precursor material, and a nominal sublimation vessel pressure value, receive a downstream second temperature value based on a downstream second temperature sensor, calculate a downstream error value equal to a difference between the downstream second temperature value and the nominal sublimation temperature value, calculate a downstream output value based on the downstream error value, provide a control signal to a downstream pressure control device based on the downstream output value, such that the control signal is configured to make the sublimation vessel pressure value equal the compensated sublimation vessel pressure value, calculate a delta-temperature value based on the cp value for the carrier gas, the heat of sublimation value for the precursor material, a vapor pressure value based on the sublimation temperature value, and the sublimation vessel pressure value, receive an upstream first temperature value based on a upstream first temperature sensor, calculate an upstream first error value equal to the downstream second temperature value plus the delta-temperature value minus the upstream first temperature value, calculate an upstream output value based on the upstream first error value, and provide a control signal to an upstream first thermal device based on the upstream first output value, such that the control signal is configured to change a temperature of the upstream first thermal device to make the upstream first temperature value equal to the sublimation downstream second temperature value plus the delta-temperature value.

Items and/or techniques described herein may provide one or more of the following capabilities, as well as other capabilities not mentioned. System variables associated with a chemical vapor deposition process may be provided to a controller. The controller may be configured to sense temperatures within a solid precursor sublimation vessel. The sublimation vessel may have one or more thermal devices configured to control the temperature of a carrier gas flowing through a precursor bed. The controller may be operably coupled to the thermal devices can configured to send control signals based on the temperatures within the sublimation vessel. The sublimation vessel may be insulated. Pressure and flow devices may be disposed on the inlet and/or outlet of the sublimation vessel. The controller may be operably coupled to the pressure and flow devices and configured to control the pressure and carrier gas flow rate through the precursor bed. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

DETAILED DESCRIPTION

Figure 1:
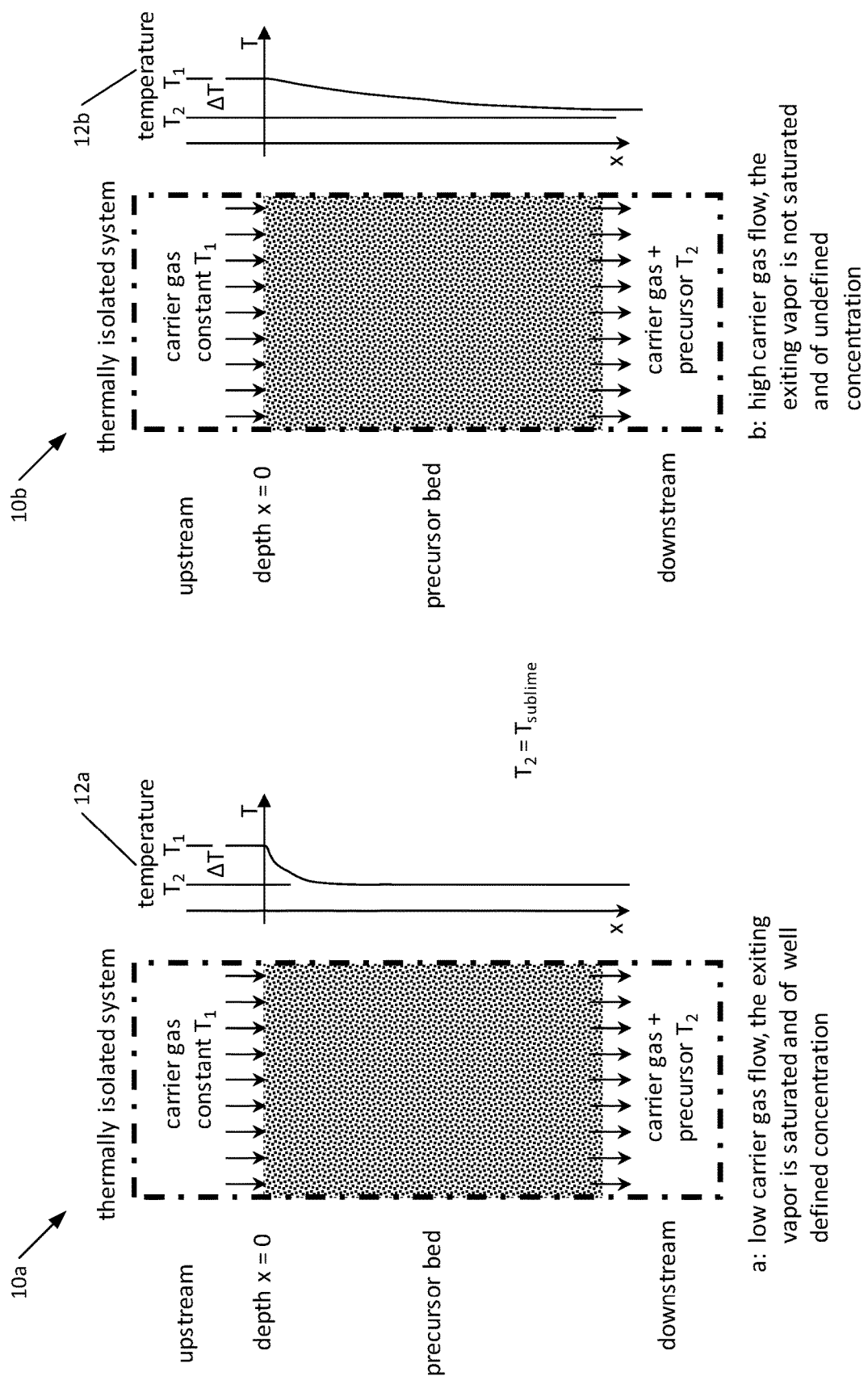
FIG. 1 is a conceptual diagram of a temperature distribution is a bed of a solid precursor at respective low and high carrier gas flows.

Techniques are discussed herein for controlling the concentration of a vapor from a solid precursor. For example, a chemical vapor deposition (CVD) process generally depends on the controlled evaporation of a liquid or solid precursor. Suitable liquid and solid precursors have a reasonably high vapor pressure. The vapor of the precursor is transported in a carrier gas to the process chamber where the precursor reacts on the surface of a substrate to form a material film. For nearly all processes the delivery rate of the precursor (in grams per second, for example) needs to be precisely controlled in order to make the desired material film. The evaporation determines the delivery rate. Thus the control of the evaporation or sublimation (in case of a solid) is critical for the CVD process to produce the desired material film. In an embodiment, the disclosure provides for controlling the temperature of the precursor via controlling heating a carrier gas, thermally isolating a sublimation vessel, and controlling the temperature upstream and downstream of the precursor bed. These techniques are examples only, and not exhaustive.

In general, the grains in powdered materials with high vapor pressures tend to fuse together and turn an originally fluid bed into a solid cake. While the porosity of the material may be maintained, the ability of the material to flow is changed. This leads to the problem of cavity formation in a precursor bed when the powdered material is being sublimed. A cavity may develop into a channel through the precursor bed. As the controlled sublimation process depends on percolation of the carrier gas through the bed, this may result in decreasing the output vapor concentration to an unpredictable level. The time of such a breakdown is unpredictable. A breakdown normally results in the loss of product made in the CVD process. In addition, there may still be 50% of the original fill of precursor in a prior art bubbler which is lost to waste.

Prior CVD source designs aim to mimic a long and narrow tube in that they lay out the precursor bed in shapes that make it longer and closer to an energy providing surface. This approach works reasonably well to prevent the cavity formation but it is limited in capacity, output, and output stability.

In an embodiment, the apparatuses and methods described herein use the carrier gas for delivering sublimation energy and for obtaining a controlled and stable output vapor concentration. The energy provided by the carrier gas may be evenly applied across the upstream surface of a precursor bed without relying on thermal conduction through walls and the precursor bed. Therefore the bed may be wide and short instead of narrow and long. For example, a single cylinder shaped sublimation vessel with an aspect ratio of length/diameter between 0.5 and 2 (compared to state of the art of 2-10) may be used to hold 3 kilograms or more of a precursor material. This is advantageous for cleaning and filling of the cylinder. It also increases the output mol/min of the source.

Referring to FIG. 1, a conceptual diagram of a temperature distribution is a bed of a solid precursor at respective low and high carrier gas flows is shown. FIG. 1 is an example only and is provided to illustrate the general relationship between a carrier gas flow rate and the precursor temperatures with in a sublimation vessel. In a first thermally isolated system 10a, a carrier gas at a first temperature T1 flows through a precursor bed at a relatively low gas flow rate. In this example, the exiting vapor is at a second temperature T2 (where T2 is the sublimation temperature of the precursor ($T_{sublime}$)). As depicted in a first temperature/depth profile curve 12a, at a low carrier gas flow the exiting vapor is saturated and of a well defined concentration. In contrast, in a second thermally isolated system 10b, the carrier gas at a first temperature T1 flows through the precursor bed at a relatively higher flow rate. In this second example, as depicted in a second temperature/depth profile curve 12b, the exiting vapor may not be saturated and of an undefined concentration.

As discussed above, in prior designs, cavity and channel formation may result from the uneven supply of energy to the precursor bed. The present disclosure uses the carrier gas as source of energy for the sublimation of a solid precursor. The sidewalls of a sublimation vessel may be thermally isolated to reduce uncontrolled energy flows. Energy may be evenly distributed to the upstream surface of the precursor bed. The temperature of the carrier gas may be controlled based on feedback from the top and the bottom of the sublimation vessel using thermal devices. In an embodiment, a downstream temperature measurement may be used to control the upstream temperature at a calculated value. The downstream temperature measurement may also be used to control the sublimation vessel pressure and to maintain a constant concentration output for a large capacity, high output sublimation source.

As depicted in FIG. 1, the system delivers energy uniformly to an upstream side of a precursor bed via the carrier gas to increase the area over which sublimation may occur. Referring to the first temperature/depth profile curve 12a, once the saturation with the precursor is complete (at a preferably short distance below the surface of the precursor bed), the temperature of the carrier gas will be lowered from $T_{sublime}+\Delta T$ to $T_{sublime}$. The thickness of this sublimation layer depends on the carrier gas flow. At low carrier gas flow, the thickness of the sublimation layer is thin. At high carrier gas flow it may reach to the downstream surface of the bed. FIG. 1 depicts that an ideal source for the sublimation of a solid bed is a thermally isolated cylinder where the temperature is controlled at the upstream side and at the downstream side of the precursor bed.

Figure 2:
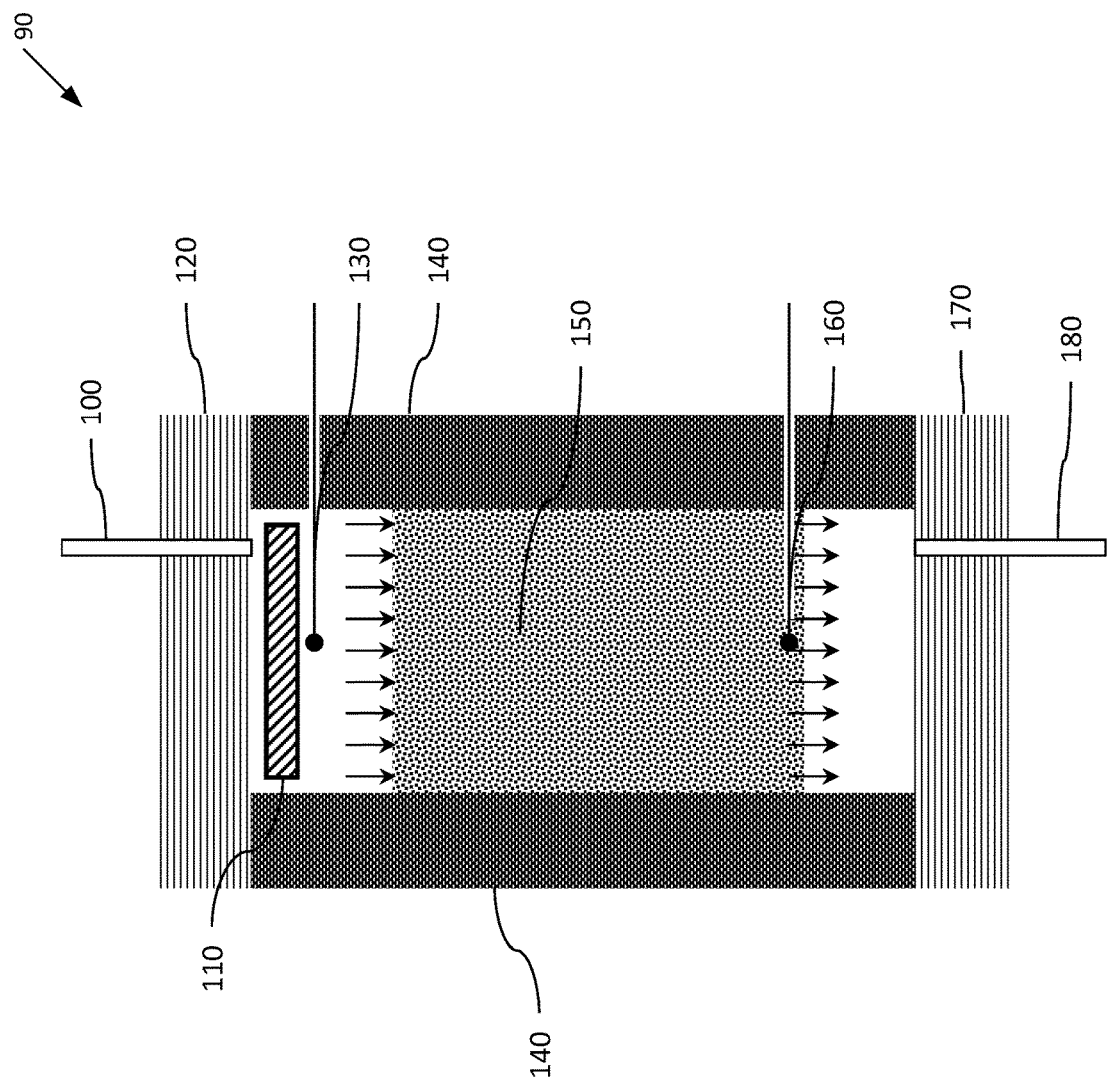
FIG. 2 is a system diagram of an example sublimation vessel for solid bed precursors.

Referring to FIG. 2, with further reference to FIG. 1, an example sublimation vessel 90 for solid bed precursors is shown. The sublimation vessel 90 includes a carrier gas inlet 100, a deflector/turbulator 110, an upstream thermal device 120 (e.g., a top thermal device), an upstream temperature sensor 130 (e.g., a top temperature sensor), a thermally insulating exterior wall 140 (i.e., a heat insulating enclosure), a precursor bed 150, a downstream temperature sensor 160 (e.g., a bottom temperature sensor), a downstream thermal device 170 (e.g., a bottom thermal device), and a vapor output 180. In an embodiment, the thermally insulating exterior wall 140 may be a thermally isolating shroud disposed around a sublimation vessel and configure to prevent energy (e.g., heat) from entering the precursor bed 150 from outside sources other than the upstream thermal device 120 and the downstream thermal device 170. In general, the upstream thermal device 120 and the downstream thermal device 170 are located at the respective upstream side of the bed and the downstream side of the bed. The thermal devices 120, 170 are configured to allow control of the upstream and the downstream temperature which are measured by the upstream temperature sensor 130 and the downstream temperature sensor 160. As an example, and not a limitation, the sublimation vessel 90 is a cylinder in a vertical orientation. Other forms and orientations may be used. For example, the sublimation vessel 90 may have a cylindrical, square, hexagonal, or any polygonal or irregular cross section, lay on its side or even be inverted. For convenience, in some instances the upstream side of the precursor bed 150 may be referred to as the top, and the downstream side of the precursor bed 150 may be referred to as the bottom.

The sublimation vessel 90 is configured to deliver energy uniformly to the upstream surface of the precursor bed 150. In general, the configuration recognizes that most of the sublimation energy is obtained from the carrier gas itself. When a carrier gas travels from the carrier gas inlet 100, through the deflector/turbulator 110, and then through the precursor bed 150, it picks up the precursor and cools. Referring back to FIG. 1, when the carrier gas is saturated at some distance below the surface of the precursor bed 150, no more heat is required and the temperature remains constant until the carrier gas plus vapor leaves the cylinder. Example temperature distributions through such a precursor bed 150 are shown in the temperature/depth profile curves 12a-b in FIG. 1. A temperature difference $\Delta T$ (deltaT) develops from the top surface of the precursor bed 150 to the bottom surface of the precursor bed 150. This temperature difference may be calculated as equation 1 below:

$$\Delta T = \frac{VaporPressure(T_{sublime})}{Sublimation\,Vessel\,Pressure} \frac{HeatOfSublimation}{c_p OfCarrierGas} \quad (1)$$

As an example for the application of equation (1), trimethylindium (TMIn), a common precursor used in the production of LEDs, may be used. The heat of sublimation of TMIn is 46.7 Wmin/standard liter(gas). The specific heat at constant pressure (i.e., "$c_p$ value") of nitrogen, a commonly used carrier gas, is 0.0217 Wmin/standard liter/Kelvin. A typical sublimation temperature for TMIn is 17° C. at which the vapor pressure is 0.87 torr. A typical sublimation vessel pressure is 225 torr. The temperature difference that needs to be maintained is:

$$\Delta T = \frac{0.87}{225} \frac{46.7}{0.0217} K = 8.43\ K.$$

This $\Delta T$ value is approximately the same for the use of hydrogen as a carrier gas. Both nitrogen and hydrogen are near ideal gases and their $c_p$ values per standard liter are similar. In general, equation (1) may be realized when the partial pressure of the carrier gas is at least ten times the vapor pressure of the precursor.

The use of TMIn as precursor is an example only, and not a limitation, as other precursor materials may be used. For example, Table 1 below provides the vapor pressure, temperature, sublimation vessel pressure ($P_{SV}$), the heat of sublimation, and the calculated $\Delta T$ for the listed precursors with a nitrogen carrier gas (i.e., $c_p$ 0.0217). The $\Delta T$ values for other precursor materials not included in Table 1 may also be determined as described above.

TABLE 1

| Precursor | Vapor Pressure | Sublimation Temperature | PSV | Heat of Sublimation | ΔT |
|---|---|---|---|---|---|
| trimethylindium (TMIn) | 0.87 torr | 17 C. | 225 torr | 62.7 kJ/mol | 8.43K |
| Tetrakis-dimethylamino Zirconium (TDMAZr) | 0.1 torr | 49 C. | 50 torr | 57.3 kJ/mol | 3.94K |
| Pentakis (dimethylamino) Tantalum PDMATa | 2.1 ton | 100 C. | 200 torr | 89.0 kJ/mol | 32.9K |

The sublimation vessel 190 utilizes the carrier gas for the delivery of the sublimation energy. The deflector/turbulator 110 assists in evenly distributing the carrier gas temperature over the upstream surface of the bed, which enables the precursor bed 150 to be wide and short instead of narrow and long. For example, deflector/turbulator 110 may be configured to shape a flow of the carrier gas in the sublimation vessel to create a uniform flow velocity of the carrier gas normal to an upstream surface of the solid precursor material in the precursor bed 150. When the temperature of the carrier gas above the precursor bed 150 is uniform, and the thermally insulating exterior walls 140 prevent heat from entering, sublimation takes place uniformly in a thin layer beneath the surface of the precursor bed 150. As a result, a single cylinder with an aspect ratio of length/diameter of less than 1 may be sized to hold a substantial amount of precursor. The low aspect ratio is also advantageous for cleaning and filling of the cylinder. It also increases the output of the source because the top surface of the bed is large which means that the carrier gas flow through a unit of the surface area is low and the temperature gradient under the surface steep. As illustrated in FIG. 1, steep temperature gradients below the upstream surface may be desirable for full utilization.

The $\Delta T$ for TMIn is 3 to 10° C. under normal operating conditions and source output. Such a temperature difference can be managed using a thermal device that comprises a resistive heater and a thermoelectric cooler. As indicated in Equation (1), $\Delta T$ does not depend on the carrier gas flow. The mass of sublimated precursor per time increases linearly with the carrier gas flow, and the energy supply also increases linearly with the carrier gas flow. Therefore, as more carrier gas flows into the sublimation vessel 90, more energy is supplied by the carrier gas, and more precursor is sublimated. A steady output concentration C may be expressed as:

$$c = \frac{VaporPressure(T_{sublime})}{Sublimation\,Vessel\,Pressure} \quad (2)$$

where, $T_{sublime}$ is the temperature at the downstream side (e.g., bottom) of the precursor bed 150.

In operation, the carrier gas enters the sublimation vessel 90 via the carrier gas inlet 100. The upstream thermal device 120 is configured to heat the carrier gas prior to entering the sublimation vessel 90 as well as heat the carrier gas in the top portion of the sublimation vessel 90. The deflector/turbulator 110 is configured to deflect/diffuse the incoming carrier gas over the top of the precursor bed 150. For example, the deflector/turbulator 110 is a mean for shaping a flow of the temperature-controlled carrier gas in the sublimation vessel to create a uniform flow velocity of the carrier gas normal to an upstream surface of the solid precursor material. The upstream temperature sensor 130 is configured detect the temperature in the upstream area or space around the precursor bed 150. The terms area and space will be used interchangeably to describe a three dimensional volume. The temperature of the upstream thermal device 120 may be controlled, at least in part, based on the temperature sensed by the upstream temperature sensor 130 and the downstream temperature sensor 160. The carrier gas flows through the precursor bed 150 picking up the sublimating precursor material, and then out through the vapor output 180. The downstream temperature sensor 160 is configured to detect the temperature in the downstream space around the vapor output 180 (i.e., the temperature of the carrier gas and the entrained vapor exiting the sublimation vessel). The downstream thermal device 170 is configured to provide heat to the sublimation vessel 90 and may be controlled, at least in part, based on the temperature sensed by the upstream temperature sensor 130 and the downstream temperature sensor 160. The thermal devices 120, 170 are typically electric heaters configured to receive an electric input and vary a heat output based on control signals. Other controllable heat sources may also be used.

Figure 3:
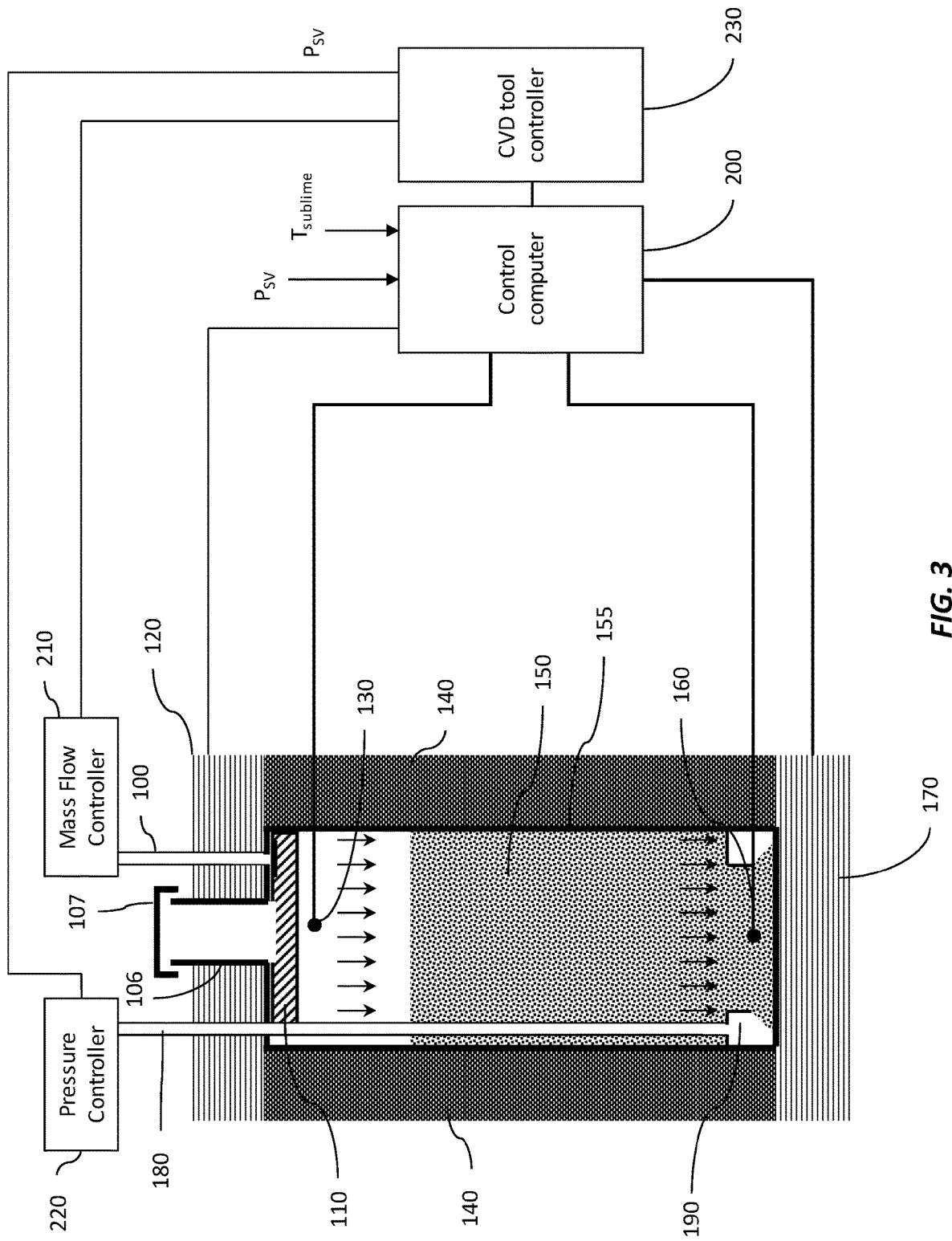
FIG. 3 is a system diagram of an example solid precursor vapor source.

Referring to FIG. 3, with further reference to FIGS. 1 and 2, an example solid precursor vapor source is shown. The solid precursor vapor source includes sublimation vessel 155 (e.g., also known as a bubbler) and attachments configured for the purpose of uniformly subliming the solid precursor. The attachments to the sublimation vessel 155 include a thermal insulation for the side exterior walls 140, an upstream thermal device 120, and a downstream thermal device 170. The thermal devices are operably coupled to and controlled by a control computer 200. In an example, the sublimation vessel 155 may be a cylindrical container with a preferably flat top and bottom. The top of the sublimation vessel 155 may include three ports: a carrier gas inlet 100 (e.g., inlet port), a vapor output 180 (e.g., output port), and a fill port 106 configured to allow access (e.g., for filling, cleaning, etc.) to the sublimation vessel 155. As an example, the fill port may have an open diameter of 10-20 mm and may be capped with a cap 107. In an example, the cap 107 of the fill port 106 may be fitted with one or two tubes (not shown in FIG. 3) that penetrates into the sublimation vessel 155 and house one or two temperature sensors such as the upstream temperature sensor 130 and the downstream temperature sensor 160. Other means may also be used to dispose the downstream temperature sensor 160 and the upstream temperature sensor 130 within the sublimation vessel 155. In an example, the temperature sensors 130, 160 may be digital sensor having a resolution of at least 0.1 degree C. (100 mK), preferably 0.0625 degrees C. (62.5 mK) or better than 0.030 degrees C. (30 mK) or lower.

The deflector or turbulator 110 is configured to transform the jet of carrier gas emanating from the carrier gas inlet 100 into turbulent flow and so to produce a uniform temperature of the carrier gas above the solid precursor material in the precursor bed 150. The carrier gas goes through the upstream thermal device 120 before entering the sublimation vessel 155 where it is heated to the amount that is required to maintain the programmed temperature at the top of the precursor bed 150 measured by the upstream temperature sensor 130. Likewise, the bottom thermal device may be used to maintain the bottom temperature measured by the downstream temperature sensor 160.

The control computer 200 may be operably coupled to the upstream thermal device 120, the downstream thermal device 170, the upstream temperature sensor 130 and the downstream temperature sensor 160 and configured to control the temperatures within the sublimation vessel 155. In an example, the control computer 200 may be operably coupled to a tool controller, such as a CVD tool controller 230 and configured to exchange process control data such as precursor information, carrier gas information, chamber pressure and carrier gas flow rates. The CVD tool controller 230 may be operably coupled to one or more mass flow controllers (MFCs) 210 and pressure controllers (PCs) 220 and configured to control the flow of the carrier gas through the sublimation vessel 155. In the example, the control computer 200 may be programmed with the vapor pressure curve and the heat of sublimation of the precursor. The control computer may also programmed with sublimation vessel pressure ($P_{SV}$) which may be maintained by the CVD tool controller 230 and the sublimation temperature $T_{sublime}$ or alternatively the desired output concentration 'c' (i.e., see equation 2 above). The data within control computer 200 may be input by the user or provided via the temperature set point $T_{sublime}$ and the desired $P_{SV}$ from the control bus of the CVD tool. The control computer 200 may utilize the data to calculate the $\Delta T$ that is required to provide the required sublimation energy. The controller is configured to drive the thermal devices 120 and 170 to maintain the top and the bottom temperature. $T_{sublime}$ may be measured in the bottom area of the sublimation vessel 155 (e.g., the area proximate to the downstream temperature sensor 160) and $T_{sublime}+\Delta T$ may be measured in the area in top of the sublimation vessel 155 (e.g., the area proximate to the upstream temperature sensor 130). The thermally insulating exterior walls 140 are configured to reduce or preferably prevent outside energy from entering the precursor bed 150 by pathways other than the carrier gas. When the heated carrier gas enters the sublimation vessel 155 through the carrier gas inlet 100 it is broken into turbulent flow by the deflector/turbulator 110. After the carrier gas has passed through the precursor bed 150 and is saturated with the precursor it is extracted at a gas extraction shelf in the sublimation vessel 190 and exits the sublimation vessel 155 via the vapor output 180.

Figure 4:
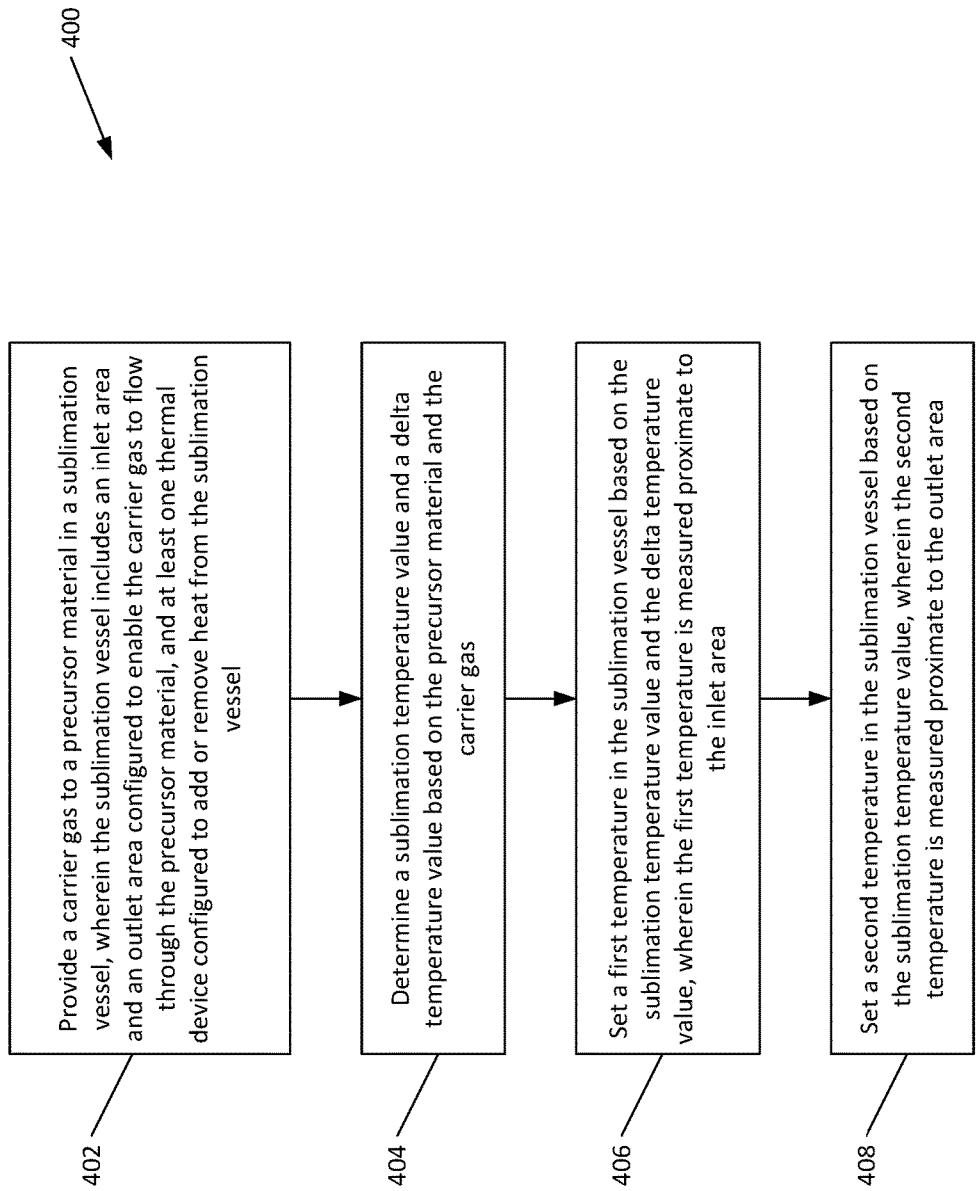
FIG. 4 is a process flow diagram of an example method for controlling a solid precursor vapor source.

Referring to FIG. 4, with further reference to FIGS. 1-3, a method 400 for controlling a solid precursor vapor source includes the stages shown. The method 400 is, however, an example only and not limiting. The method 400 may be altered, e.g., by having stages added, removed, rearranged, combined, performed concurrently, and/or having single stages split into multiple stages. For example, stage 404 described below for determining a sublimation temperature value and a delta temperature value may be performed before stage 402. Still other alterations to the method 400 as shown and described are possible.

At stage 402, the method 400 includes providing a carrier gas to a precursor material in a sublimation vessel, wherein the sublimation vessel includes an inlet area 102 and an outlet area 162 configured to enable the carrier gas to flow through the precursor material, and at least one thermal device configured to add or remove heat from the sublimation vessel. In an example, the carrier gas inlet 100 may be a means for providing the carrier gas to the precursor bed 150. The carrier gas may be, for example, nitrogen, hydrogen, or other gases used in chemical vapor deposition processes. The mass flow controller 210 may be used to regulate the flow of the carrier gas into the sublimation vessel 155. One or more deflectors or turbulators 110 may be used to diffuse the carrier gas over the precursor bed 150.

The inlet area 102 of the sublimation vessel 155 may be defined as the area or volume of space within the sublimation vessel proximate to the precursor bed 150 and the upstream temperature sensor 130. The outlet area 162 of the sublimation vessel 155 may be defined as the area or volume of space within the sublimation vessel proximate to, or within, the bottom of the precursor bed 150 and the downstream temperature sensor 160. The at least one thermal device may be the upstream thermal device 120, the downstream thermal device 170, or other thermal devices configured to heat the carrier gas entering the sublimation vessel.

At stage 404, the method 400 includes determining a sublimation temperature value and a delta temperature value based on the precursor material and the carrier gas. In an example, the control computer 200 may be a means for determining the sublimation temperature value and the delta temperature value. The sublimation temperature value may be the heat of sublimation value associated with a precursor material (e.g., as described in Table 1 above), and the delta temperature value ($\Delta T$) may be calculated based on equation 1 above. In an example, the control computer 200 may include a data structure (e.g., data base, flat file, look-up table) configured to store the sublimation temperature value and delta temperature value and the associated precursor material and the carrier gas information (e.g., the $c_p$ value). In an example, a user may enter the sublimation temperature value and delta temperature value into the control computer 200. The sublimation temperature value and delta temperature value may be provided to the control computer 200 by other sources (e.g., local or networked) such as the CVD tool controller 230, or other manufacturing systems. The sublimation temperature value and the delta temperature value may vary based on the CVD application and the associated precursor material, carrier gas and the pressure of the sublimation vessel pressure for the CVD application.

At stage 406, the method 400 includes setting a first temperature in the sublimation vessel based on the sublimation temperature value and the delta temperature value, wherein the first temperature is measured proximate to the inlet area 102. The upstream thermal device 120 and the upstream temperature sensor 130 may be a means for setting the first temperature in the sublimation vessel. In an example, the carrier gas may be heated or cooled as it flows through the upstream thermal device 120 and into the sublimation vessel 155. The temperature of the upstream thermal device 120 may be a component in a closed-loop control system (e.g., PID) with the upstream temperature sensor 130 and the control computer 200. Other control solutions may also be used. The temperature proximate to the inlet area 102 (i.e., at the top of the precursor bed 150) is controlled to be approximately the sum of the sublimation temperature value and the delta temperature value (i.e., $T_{sublime}+\Delta T$). For example, a typical sublimation temperature value for TMIn is 17 degrees Celsius at which the vapor pressure is 0.87 torr. The delta temperature value ($\Delta T$) for TMIn as described above is 3 to 10 degrees Celsius. In this example, the first temperature in the sublimation vessel may be set to a value within a range of 20-30 degrees Celsius. The upstream thermal device 120 may be a resistive heater and a thermoelectric cooler configured to maintain the temperature in the inlet area 102 in this range.

At stage 408, the method 400 includes setting a second temperature in the sublimation vessel based on the sublimation temperature value, wherein the second temperature is measured proximate to the outlet area 162. In an example, the downstream thermal device 170 and the downstream temperature sensor 160 are a means for setting the second temperature in the sublimation vessel. The temperature of the downstream thermal device 170 may be a component in a closed-loop control system (e.g., PID) with the downstream temperature sensor 160 and the control computer 200. Other control solutions may also be used. The temperature proximate to the outlet area 162 (i.e., at the bottom of the precursor bed 150) is controlled to be approximately the sublimation temperature value (i.e., $T_{sublime}$). Continuing the TMIn example, the sublimation temperature value for TMIn is 17 degrees Celsius at which the vapor pressure is 0.87 torr. The downstream thermal device 170 may be a resistive heater and a thermoelectric cooler configured to maintain the temperature in the outlet area 162 in this range.

In operation, the control computer 200 may be programmed with an algorithm including receiving $T_{sublime}$, sublimation vessel pressure, precursor material information and carrier gas information. The algorithm may calculate $\Delta T$ from $T_{sublime}$, the sublimation vessel pressure, the heat of sublimation and the $c_p$ of the carrier gas based on equation 1. The algorithm may adjust the flow of the carrier gas based on CVD process requirements. The algorithm may iteratively adjust the upstream temperature to $T_{sublime}+\Delta T$, and the downstream temperature to $T_{sublime}$ based on input from the respective temperature sensors.

Figure 5:
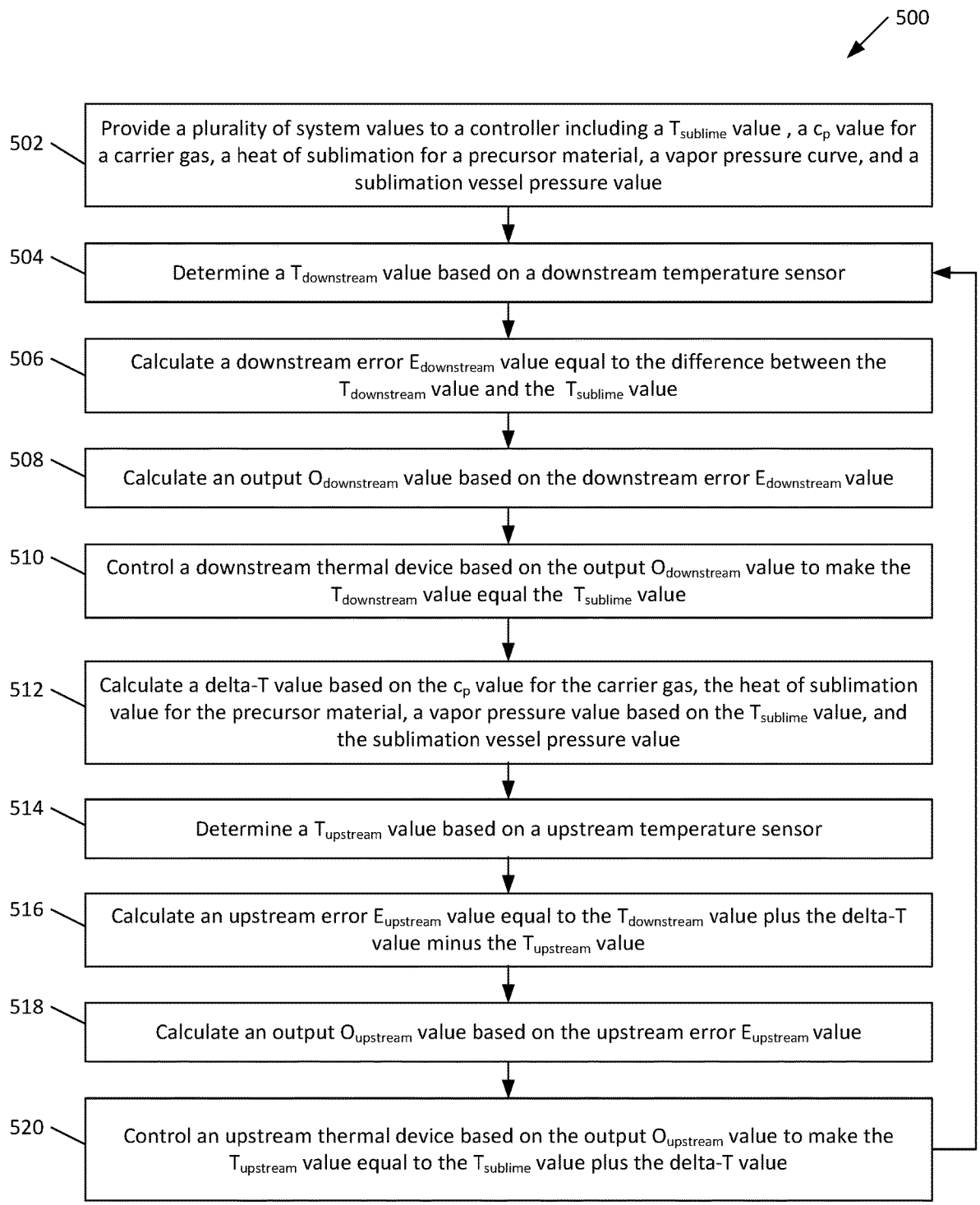
FIG. 5 is a process flow diagram of an example process for controlling downstream and upstream thermal devices in a solid precursor vapor source.

Referring to FIG. 5, with further reference to FIGS. 1-3, a process 500 for controlling downstream and upstream thermal devices in a solid precursor vapor source includes the stages shown. The process 500 is, however, an example only and not limiting. The process 500 may be altered, e.g., by having stages added, removed, rearranged, combined, performed concurrently, and/or having single stages split into multiple stages. The control computer 200 may be a means for executing the process 500.

Figure 12A:
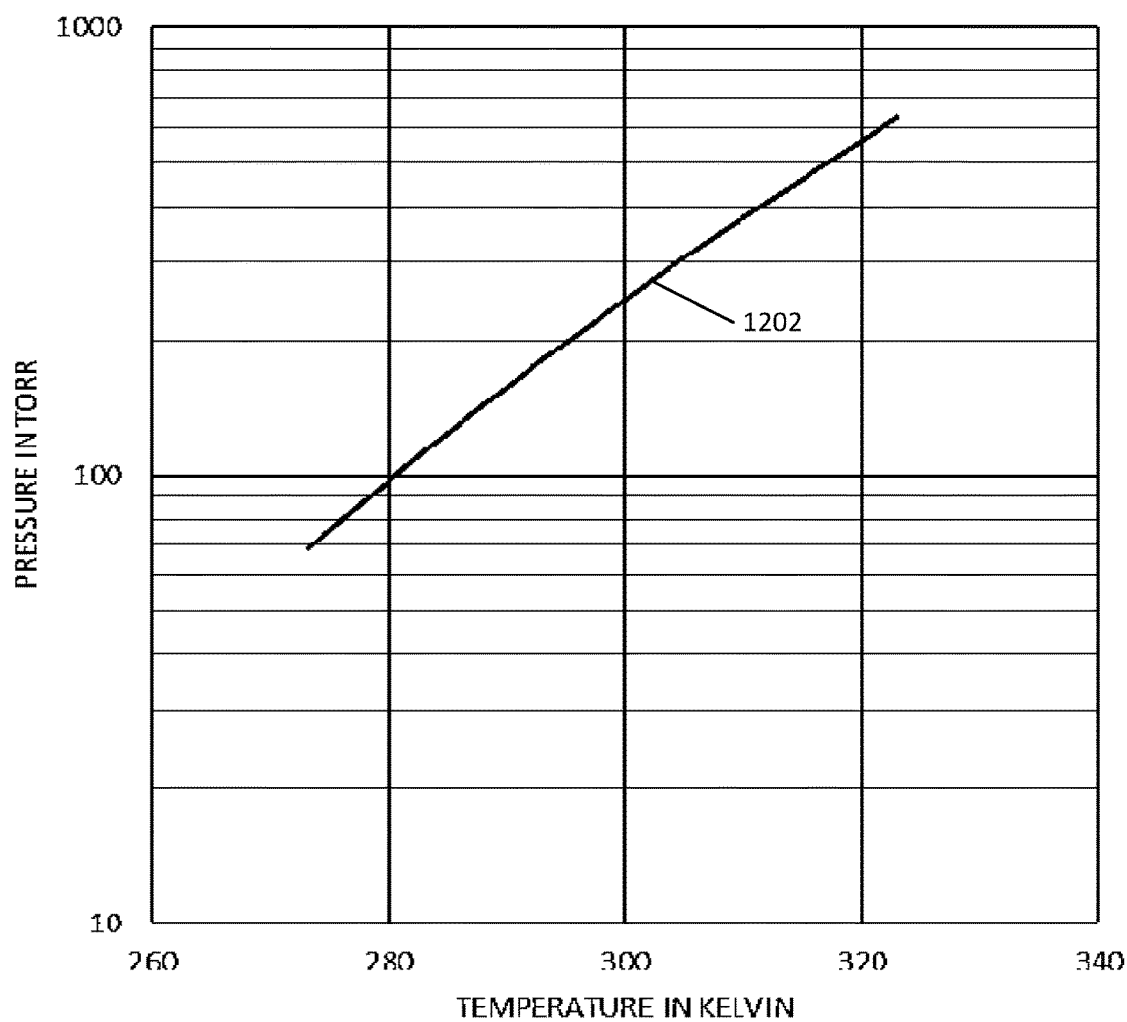
FIGS. 12A and 12B are graphic examples of vapor pressure curves.
Figure 12B:
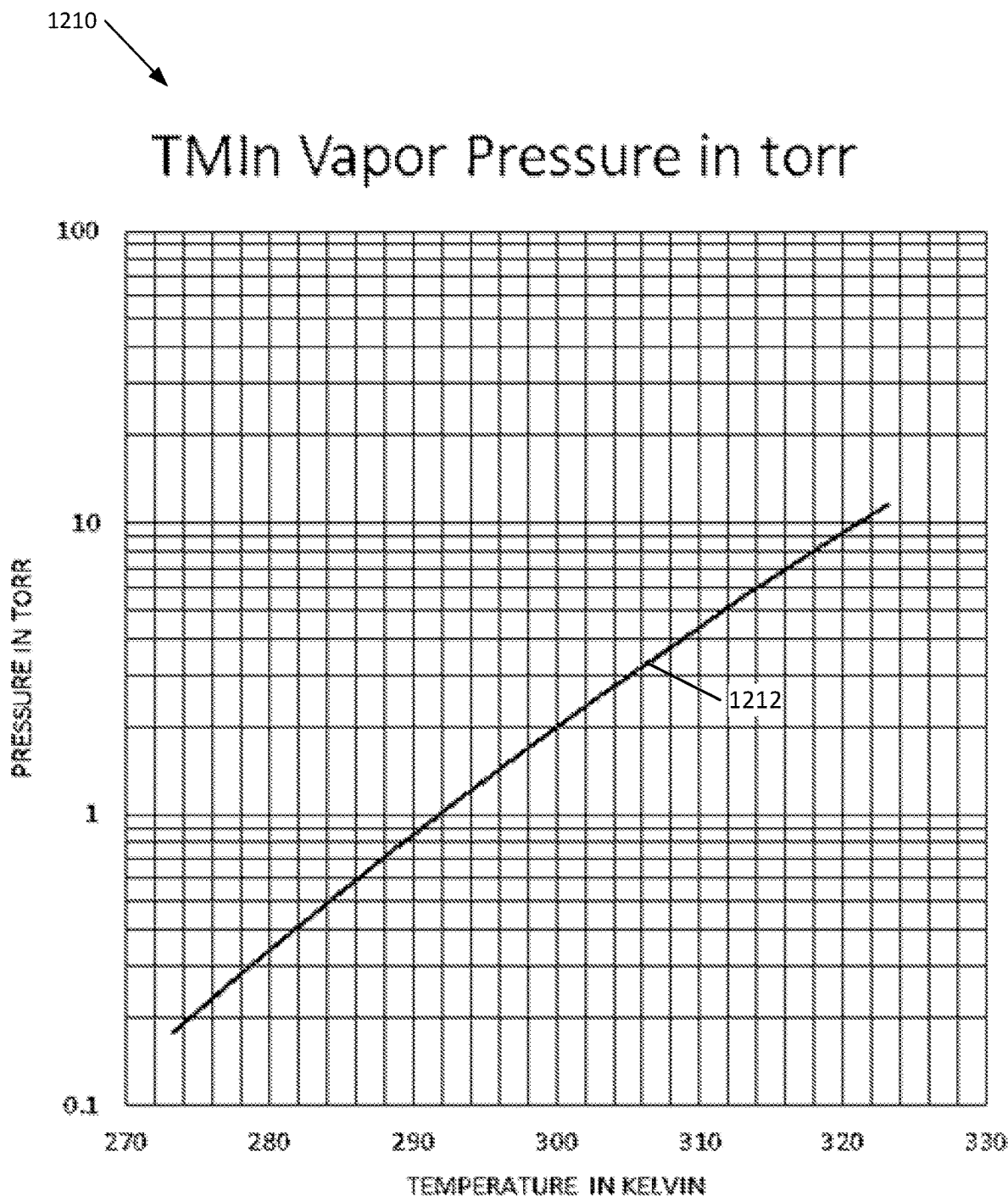

At stage 502, the process 500 includes providing a plurality of system values to a controller including a $T_{sublime}$ value, a $c_p$ value for a carrier gas, a heat of sublimation for a precursor material, a vapor pressure curve, and a sublimation vessel pressure ($P_{SV}$) value. The control computer 200 may be a means for providing the plurality of system values. For example, the control computer 200 may include a memory with one or more data structures containing the system values. Such a data structure may obtain data from other electronic sources (e.g., local or networked), or may receive them via a user interface (e.g., user data entry). In an example, one or more of the system values may be obtained via another system such as the CVD tool controller 230. Referring to FIGS. 12A and 12B, the vapor pressure curve may be an array of values in a data structure corresponding to vapor pressure values as a function of temperature for different precursor materials. For example, a first graph 1200 includes a first vapor pressure curve 1202 for trimethylgallium (TMGa), and a second graph 1210 includes a second vapor pressure curve 1212 for trimethylindium (TMIn). Other vapor curves for other precursor materials may also be stored as array values in the CVD tool controller 230. The $c_p$ value for the carrier gas is the specific heat at constant pressure for the carrier gas (e.g., 0.0217 Wmin/standard liter/Kelvin for nitrogen). The sublimation vessel pressure ($P_{SV}$) value is the pressure within the sublimation vessel 155 and more specifically the pressure near the outlet area 162. The $T_{sublime}$ may be a nominal temperature that a CVD process recipe uses for the precursor temperature. That is, because sublimation cools the precursor, the temperature of the precursor will not be $T_{sublime}$ when the process is running. The process 500 determines the difference between $T_{sublime}$ and other measured temperatures (e.g., $T_{downstream}$ and $T_{upstream}$) and makes adjustments temperature controllers to keep the mass flow of the precursor constant. The heat of sublimation for a precursor material is a material constant of the precursor. That is, the heat of sublimation represents the energy that needs to be supplied in order to sublime one unit mass of precursor. As described herein, for many precursors, the sublimation energy may be supplied through heat from the carrier gas.

At stage 504, the process 500 includes determining a $T_{downstream}$ value based on a downstream temperature sensor. The control computer 200 may be a means for determining the $T_{downstream}$ value. The downstream temperature sensor 160 is operably coupled to the control computer 200 and is configured to provide a temperature reading in the area proximate to the bottom of the precursor bed 150.

At stage 506, the process 500 includes calculating a downstream error $E_{downstream}$ value equal to the difference between the $T_{downstream}$ value and the $T_{sublime}$ value. The control computer 200 may be a means for determining the downstream error $E_{downstream}$ value. The downstream error $E_{downstream}$ value is the difference between the temperature measured by the downstream temperature sensor 160 and the $T_{sublime}$ value provided at stage 502.

At stage 508, the process 500 includes calculating an output $O_{downstream}$ value based on the downstream error $E_{downstream}$ value. The control computer 200 may be a means for calculating the output $O_{downstream}$ value. The output $O_{downstream}$ value may be a digital or analog control signal based on the size of the downstream error $E_{downstream}$ value, and configured to adjust the operation of the downstream thermal device 170 (e.g., increase or decrease the temperature output) as to drive the downstream error $E_{downstream}$ to minimum.

At stage 510, the process 500 includes controlling a downstream thermal device based on the output $O_{downstream}$ value to make the $T_{downstream}$ value equal the $T_{sublime}$ value. The control computer 200 may be a means of controlling the downstream thermal device 170. The output $O_{downstream}$ value is based on the difference between the current $T_{downstream}$ value and the programmed $T_{sublime}$ value. The control computer 200 is configured to change the temperature of the downstream thermal device 170 to allow the temperature in the area of the downstream temperature sensor 160 to be equal to the $T_{sublime}$ value.

At stage 512, the process 500 includes calculating a delta-T value based on the $c_p$ value for the carrier gas, the heat of sublimation value for the precursor material, a vapor pressure value based on the $T_{sublime}$ value, and the sublimation vessel pressure ($P_{SV}$) value. The control computer 200 may be a means for calculating the delta-T value. For example, the delta-T value ($\Delta T$) may be calculated based on equation 1 (e.g., (the vapor pressure based on the $T_{sublime}$ value/the sublimation vessel pressure value)*(heat of sublimation value for the precursor material/the $c_p$ value for the carrier gas).

At stage 514, the process 500 includes determining a $T_{upstream}$ value based on a upstream temperature sensor. The control computer 200 may be a means for determining the $T_{upstream}$ value. The upstream temperature sensor 130 is operably coupled to the control computer 200 and configured to sense the temperature in the area at the top of the precursor bed 150 in the sublimation vessel 155.

At stage 516, the process 500 includes calculating an upstream error $E_{upstream}$ value equal to the $T_{downstream}$ value plus the delta-T value minus the $T_{upstream}$ value. The control computer 200 may be a means for determining the upstream error $E_{upstream}$ value. The upstream error $E_{upstream}$ value is the difference between the temperature measured by the upstream temperature sensor 130 and the total of the $T_{sublime}$ value provided at stage 502 and the delta-T value calculated at stage 512 (i.e., $E_{upstream} = (T_{sublime} + \Delta T) - T_{upstream}$).

At stage 518, the process 500 includes calculating an output $O_{upstream}$ value based on the upstream error $E_{upstream}$ value. The control computer 200 may be a means for calculating the output $O_{upstream}$ value. The output $O_{upstream}$ value may be a digital or analog control signal based on the size of the upstream error $E_{upstream}$ value, and configured to adjust the operation of the upstream thermal device 120 (e.g., increase or decrease the temperature output) as to drive the upstream error $E_{upstream}$ to the minimum.

At stage 520, the process 500 includes controlling an upstream thermal device based on the output $O_{upstream}$ value to make the $T_{upstream}$ value equal to the $T_{sublime}$ value plus the delta-T value. The control computer 200 may be a means of controlling the upstream thermal device 120. The output $O_{upstream}$ value is based on the difference between the current $T_{upstream}$ value and the total of the programmed $T_{sublime}$ value and the computed delta-T value (i.e., $T_{sublime} + \Delta T$). The control computer 200 is configured to change the temperature of the upstream thermal device 120 to allow the temperature in the area of the upstream temperature sensor 130 to be equal to the total of the programmed $T_{sublime}$ value and the computed delta-T value (i.e., $T_{sublime} + \Delta T$).

The process 500 may return to stage 504 to continue to control the upstream and downstream thermal devices 120, 170.

Figure 6:
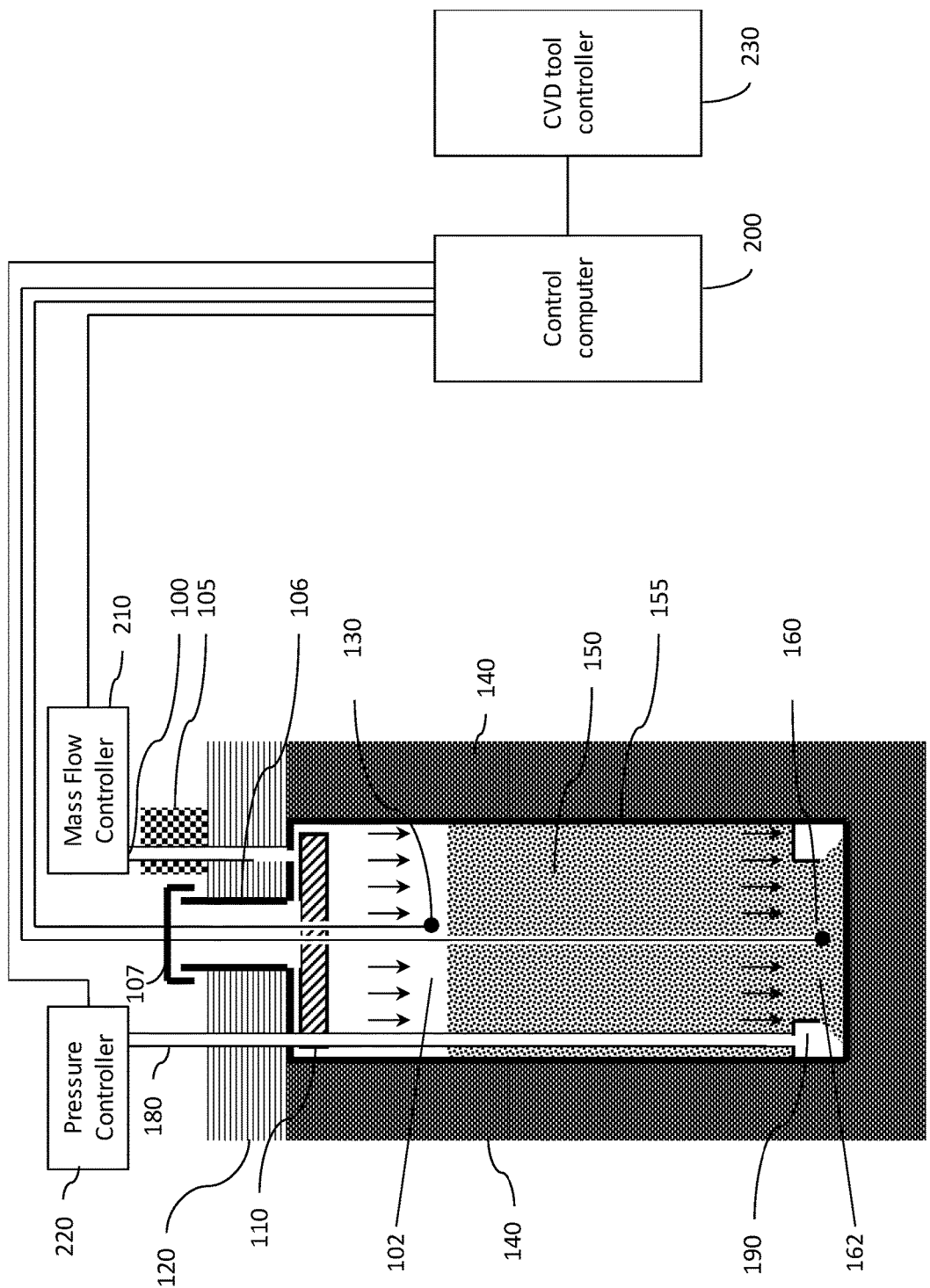
FIG. 6 is system diagram of a second example solid precursor vapor source.

Referring to FIG. 6, with further reference to FIGS. 1, 2 and 3, a second example solid precursor vapor source is shown. The second example of a solid precursor vapor source is similar to the solid precursor vapor source of FIG. 3, but does not require the downstream thermal device 170. The second example of a solid precursor vapor source includes the sublimation vessel 155 (e.g., bubbler), the thermal insulation for the exterior walls 140, the upstream thermal device 120, and a carrier gas heater 105 (e.g., inlet heater). The upstream thermal device 120 and the carrier gas heater 105 are operably coupled to and controlled by the control computer 200. While FIG. 6 shows both the upstream thermal device 120 and the carrier gas heater 105, in an embodiment the carrier gas heater 105 may be used without the upstream thermal device 120 as a single carrier gas temperature control device disposed proximate to the carrier gas inlet 100. The top of the sublimation vessel 155 includes the carrier gas inlet 100 (e.g., inlet port), the vapor output 180 (e.g., output port), and the fill port 106 configured to allow access (e.g., for filling, cleaning, etc.) the sublimation vessel 155. The cap 107 of the fill port 106 includes one or two tubes that penetrates into the sublimation vessel 155 and house the upstream temperature sensor 130 and the downstream temperature sensor 160. The deflector or turbulator 110 transforms the jet of carrier gas emanating from the carrier gas inlet 100 into turbulent flow. The carrier gas goes through the carrier gas heater 105 before entering the sublimation vessel 155 where it is heated to the amount that is required to maintain the programmed temperature at the top of the precursor bed 150 as measured by the upstream temperature sensor 130. The control computer 200 may be operably coupled to the upstream thermal device 120, the carrier gas heater 105, the upstream temperature sensor 130 and the downstream temperature sensor 160 and configured to control the temperatures within the sublimation vessel 155.

In this embodiment the control computer 200 may be operably coupled to and configured to adjust the mass flow controller (MFC) 210 and the pressure controller 220. The control computer 200 is configured to calculate a compensated pressure or flow from the difference between nominal temperature $T_{nominal}$ (i.e., the temperature that the user has used for the design of the CVD process) and the temperature measured by the downstream temperature sensor 160. The compensation factor is the ratio of vapor pressure of the precursor at $T_{nominal}$ and vapor pressure at $T_{sublime}$ as measured by the downstream temperature sensor 160. The flow is compensation factor is:

$$f_{flow} = \frac{\text{vapor pressure}(T_{nominal})}{\text{vapor pressure}(T_{sublime})} \quad (3)$$

and the pressure compensation factor is:

$$f_{pressure} = \frac{\text{vapor pressure}(T_{sublime})}{\text{vapor pressure}(T_{nominal})} \quad (4)$$

Figure 7:
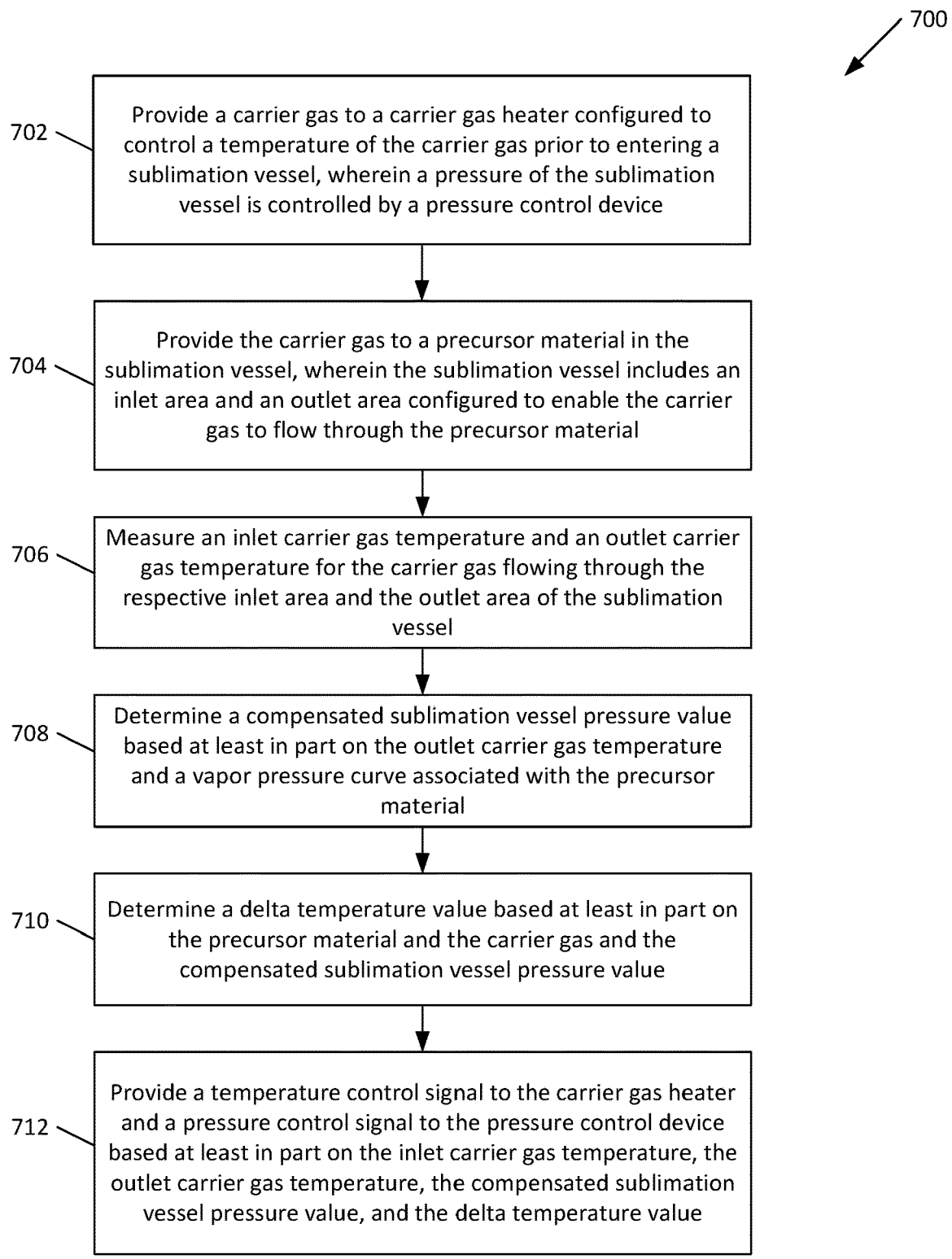
FIG. 7 is a process flow diagram of an example method for controlling the second example of a solid precursor vapor source.

Referring to FIG. 7, with further reference to FIG. 6, a method 700 for controlling the second example of a solid precursor vapor source includes the stages shown. The method 700 is, however, an example only and not limiting. The method 700 may be altered, e.g., by having stages added, removed, rearranged, combined, performed concurrently, and/or having single stages split into multiple stages.

At stage 702, the method 700 includes providing a carrier gas to a carrier gas heater configured to control the temperature of the carrier gas prior to entering a sublimation vessel, wherein the pressure of the sublimation vessel is controlled by a pressure control device. In an example, the carrier gas inlet 100 may be means for providing the carrier gas to the carrier gas heater 105. The carrier gas may be, for example, nitrogen, hydrogen, or other gases used in chemical vapor deposition processes. The mass flow controller 210 may be used to regulate the flow of the carrier gas into the carrier gas heater 105 and the sublimation vessel 155. The mass flow controller 210 and the control computer 200 are configured to provide the carrier gas to the sublimation vessel 155 at a controlled flow rate. The pressure controller 220 and the control computer 200 are configured to control the pressure within the sublimation vessel 155. The flow rate and pressure values may be based on CVD process parameters and the flow compensation factors described in equations 3 and 4 above.

At stage 704, the method 700 includes providing the carrier gas to a precursor material in the sublimation vessel, wherein the sublimation vessel includes an inlet area 102 and an outlet area 162 configured to enable the carrier gas to flow through the precursor material. In an example, the deflector or turbulator 110 may be a means for providing the carrier gas to the precursor bed 150. The inlet area 102 of the sublimation vessel 155 may be defined as the area or volume of space within the sublimation vessel proximate to the precursor bed 150 and the upstream temperature sensor 130. The outlet area 162 of the sublimation vessel 155 may be defined as the area or volume of space within the sublimation vessel proximate to, or within, the bottom of the precursor bed 150 and the downstream temperature sensor 160.

At stage 706, the method 700 includes measuring an inlet carrier gas temperature and an outlet carrier gas temperature for the carrier gas flowing through the respective inlet area 102 and the outlet area 162 of the sublimation vessel. The upstream temperature sensor 130 and the downstream temperature sensor 160 may be a means for measuring the respective inlet carrier gas temperature and the outlet carrier gas temperature. The control computer 200 is configured to utilize the upstream temperature sensor 130 and the downstream temperature sensor 160 to measure the temperatures of the inlet and the outlet areas (102, 162).

At stage 708, the method 700 includes determining a compensated sublimation vessel pressure value based at least in part on the outlet gas temperature and a vapor pressure curve associated with the precursor material. The control computer 200 may be a means for determining the compensated sublimation vessel pressure. The downstream temperature sensor 160 is used to measure the downstream temperature $T_{downstream}$, and the control computer 200 is configured to determine the vapor pressure of the precursor material based on the downstream temperature and the vapor pressure curve (e.g., temperature versus pressure curves such as graphically depicted in FIGS. 12A and 12B). The control computer 200 includes a nominal temperature ($T_{nominal}$) and the corresponding vapor pressure for $T_{nominal}$ based on the requirements of the CVD process. A pressure) pressure compensation factor ($f_{pressure}$) may be determined based on the ratio of vapor pressure of the precursor at $T_{nominal}$ and vapor pressure at $T_{sublime}$ as measured by the downstream temperature sensor 160, as described in equation 4. The compensated sublimation vessel pressure value is then the $f_{pressure}$ times a nominal pressure ($P_{nominal}$), where $P_{nominal}$ is based on the CVD process requirements. Alternatively, a flow compensation factor ($f_{flow}$) may be determined based on the ratio of vapor pressure of the precursor at $T_{nominal}$ and vapor pressure at $T_{sublime}$ as measured by the downstream temperature sensor 160, as described in equation 4. The compensated sublimation vessel carrier gas flow value is then the $f_{flow}$ times a nominal carrier gas flow ($F_{nominal}$), where $F_{nominal}$ is based on the CVD process requirements.

At stage 710, the method 700 includes determining a delta temperature value based at least in part on the precursor material and the carrier gas and the compensated sublimation vessel pressure value. The control computer 200 may be a means for determining the delta temperature value. The delta temperature value ($\Delta T$) may be calculated based on equation 1 (e.g., (the vapor pressure based on the $T_{sublime}$ value/the compensated sublimation vessel pressure value)* (heat of sublimation value for the precursor material/the $c_p$ value for the carrier gas).

At stage 712, the method 700 includes providing a temperature control signal to the carrier gas heater. Additionally, stage 712 may include providing a pressure control signal to the pressure controller 220, or alternatively a flow control signal to the mass flow controller 210. The respective control signals are based at least in part on the inlet carrier gas temperature, the outlet carrier gas temperature, the compensated sublimation vessel pressure value, and the delta temperature value. The control computer 200 may be a means for providing control signals to the carrier gas heater and the pressure controller 220 and the mass flow controller 210. The pressure control and the flow control signals are based on compensated sublimation vessel pressure and flow values determined at stage 708. The pressure controller 220 may be configured to maintain the pressure within the sublimation vessel 155 at the compensated sublimation vessel pressure value. Alternatively, the mass flow controller 210 may be configured to maintain the carrier gas flow within the sublimation vessel 155 at the compensated sublimation vessel flow value. The temperature control signal may be provided to the carrier gas heater 105 to cause the carrier gas heater to add or remove energy from the carrier gas. For example, the carrier gas heater 105 may be configured to make the temperature of the carrier gas approximately equal to the sum of $T_{downstream}$ (as detected by the downstream temperature sensor 160) and the delta temperature ($\Delta T$, as calculated at stage 710).

Figure 8:
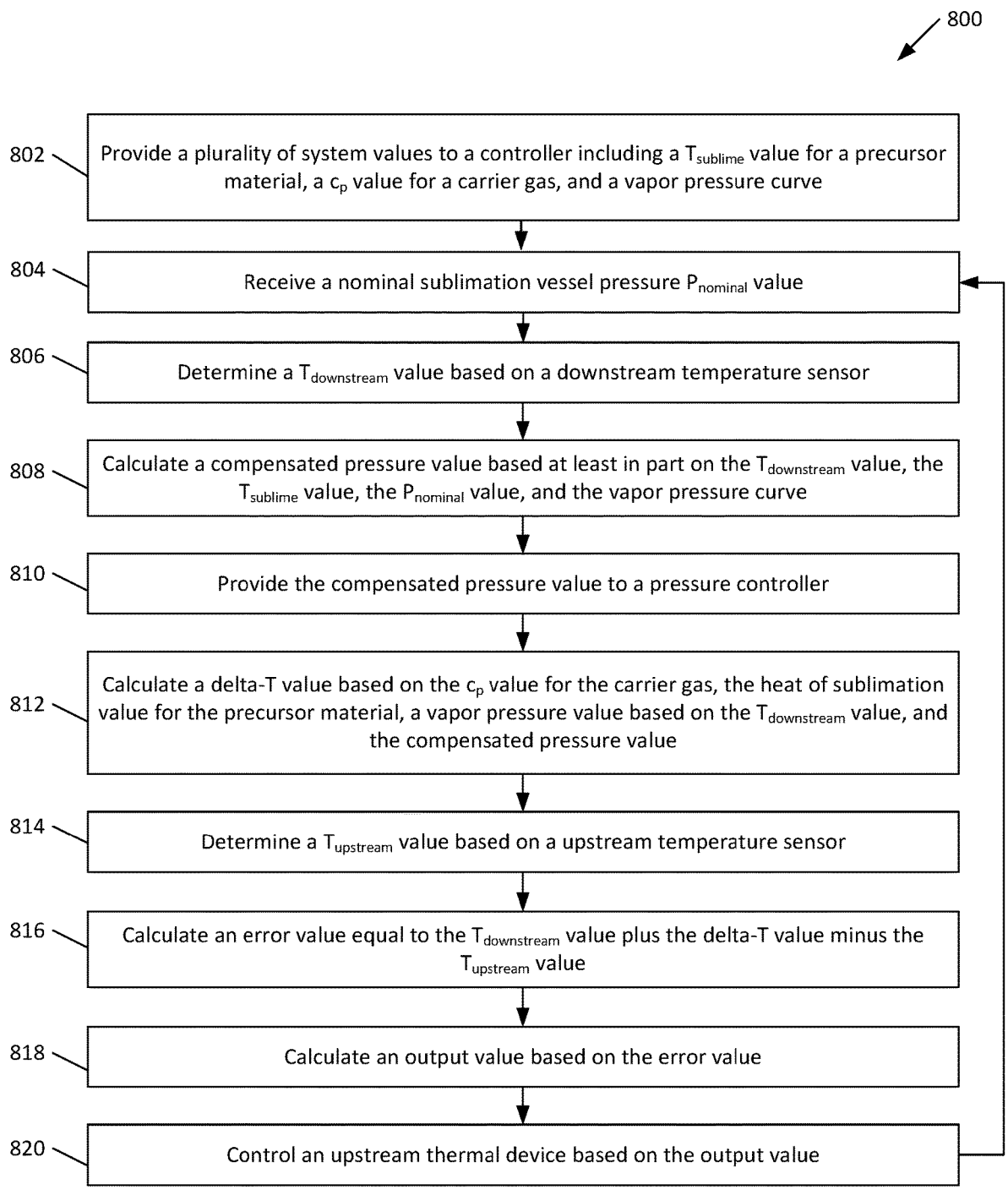
FIG. 8 is a process flow diagram of an example method for controlling upstream thermal devices in the second example solid precursor vapor source.

Referring to FIG. 8, with further reference to FIG. 6, a process 800 for controlling upstream thermal devices in the second example solid precursor vapor source includes the stages shown. The process 800 is, however, an example only and not limiting. The process 800 may be altered, e.g., by having stages added, removed, rearranged, combined, performed concurrently, and/or having single stages split into multiple stages. Particularly the substitution of pressure control with flow control according to method 700 may be included in process 800. The control computer 200 may be a means for executing the process 800.

At stage 802, the process 800 includes providing a plurality of system values to a controller including a $T_{sublime}$ value for a precursor material, a $c_p$ value for a carrier gas, and a vapor pressure curve. The control computer 200 may be a means for providing the plurality of system values. For example, the control computer 200 may include a memory with one or more data structures containing the system values. Such a data structure may obtain data from other electronic sources (e.g., local or networked), or may be receive them via a user interface (e.g., user data entry). In an example, the data may be obtained via another system such as the CVD tool controller 230. The vapor pressure curve may be an array of values in a data structure corresponding to vapor pressure values as a function of temperature for different precursor materials. For example, referring to FIGS. 12A and 12B, the vapor pressure curve may be an array of values in a data structure corresponding to vapor pressure values as a function of temperature for different precursor materials, such as the first vapor pressure curve 1202 for trimethylgallium (TMGa), and the second vapor pressure curve 1212 for trimethylindium (TMIn). Other vapor curves for other precursor materials may also be stored as array values in the control computer 200. The $c_p$ value for the carrier gas is the specific heat at constant pressure for the carrier gas (e.g., 0.0217 Wmin/standard liter/Kelvin for nitrogen). The $T_{sublime}$ may be a nominal temperature that a CVD process recipe uses for the precursor temperature. That is, because sublimation cools the precursor, the temperature of the precursor will not be $T_{sublime}$ when the process is running.

At stage 804, the process 800 includes receiving a nominal sublimation vessel pressure $P_{nominal}$ value. The control computer 200 may be a means for receiving the $P_{nominal}$ value. The $P_{nominal}$ value may be the nominal pressure that a CVD process uses for the precursor pressure. For example, the $P_{nominal}$ value may be received from the CVD tool controller 230 or input to the control computer 200 by a user. The $P_{nominal}$ value, as well as the other system values used in the process 800 may be provided via other electronic media such as local and/or remote memory devices as known in the art.

At stage 806, the process 800 includes determining a $T_{downstream}$ value based on a downstream temperature sensor. The control computer 200 may be a means for determining the $T_{downstream}$ value. The downstream temperature sensor 160 is operably coupled to the control computer 200 and is configured to provide a temperature reading in the area proximate to the bottom of the precursor bed 150.

At stage 808, the process 800 includes calculating a compensated pressure value based at least in part on the $T_{downstream}$ value, the $T_{sublime}$ value, the $P_{nominal}$ value, and the vapor pressure curve. The control computer 200 may be a means for calculating the compensated pressure value. The downstream temperature sensor 160 is configured to measure the $T_{downstream}$ value and the control computer 200 is configured to determine the vapor pressure of the precursor material based on the $T_{downstream}$ value and the vapor pressure curve. A pressure compensation factor ($f_{pressure}$) may be determined based on the ratio of vapor pressure of the precursor at $T_{downstream}$ divided by the vapor pressure at $T_{sublime}$ (where the vapor pressure values are based on the vapor pressure curves). The compensated pressure value is then the $f_{pressure}$ times a nominal pressure ($P_{nominal}$). This result establishes the precursor concentration.

At stage 810, the process 800 includes providing the compensated pressure value to a pressure controller. The control computer 200 may be a means for providing the compensated pressure value. In an example, the control computer 200 is operably coupled to the pressure controller 220 and is configured to provide control signals to adjust the pressure within the sublimation vessel 155. Thus, the control computer 200 is configured to control the sublimation vessel pressure based on the calculated compensated pressure value.

At stage 812, the process 800 includes calculating a delta-T value based on the $c_p$ value for the carrier gas, the heat of sublimation value for the precursor material, a vapor pressure value based on the $T_{downstream}$ value, and the compensated pressure value. The control computer 200 may be a means for calculating the delta-T value. For example, the delta-T value ($\Delta T$) may be calculated based on equation 1 (e.g., (the vapor pressure based on the $T_{downstream}$ value/the compensated pressure value)*(heat of sublimation value for the precursor material/the $c_p$ value for the carrier gas).

At stage 814, the process 800 includes determining a $T_{upstream}$ value based on a upstream temperature sensor. The control computer 200 may be a means for determining the $T_{upstream}$ value. The upstream temperature sensor 130 is operably coupled to the control computer 200 and configured to sense the temperature in the area at the top of the precursor bed 150 in the sublimation vessel 155.

At stage 816, the process 800 includes calculating an error value equal to the $T_{downstream}$ value plus the delta-T value minus the $T_{upstream}$ value. The control computer 200 may be a means for determining the error value. The error value is the difference between the temperature measured by the upstream temperature sensor 130 and the total of the $T_{sublime}$ value provided at stage 802 and the delta-T value calculated at stage 812 (i.e., error value=($T_{sublime}+\Delta T$)−$T_{upstream}$).

At stage 818, the process 800 includes calculating an output value based on the error value. The control computer 200 may be a means for calculating the output value. The output value may be one or more digital or analog control signal based on the size of the error value, and configured to adjust the operation of the upstream thermal device 120 and/or the carrier gas heater 105 (e.g., increase or decrease the temperature output) so as to minimize the error value.

At stage 820, the process 800 includes controlling an upstream thermal device based on the output value. The control computer 200 may be a means of controlling an upstream thermal device. In an example, the upstream thermal device may be the carrier gas heater 105. The control computer 200 may be configured to control the heat of the carrier gas heater 105 and/or the upstream thermal device 120. In general, the output value is based on the difference between the current $T_{upstream}$ value and the total of the programmed $T_{downstream}$ value and the computed delta-T value (i.e., $T_{downstream}+\Delta T$). The control computer 200 is configured to change the temperature of the carrier gas heater 105 and/or the upstream thermal device 120 to allow the temperature in the area of the upstream temperature sensor 130 to be equal to the total of the $T_{downstream}$ value and the computed delta-T value (i.e., $T_{downstream}+\Delta T$).

The process 800 may return to stage 804 to continue to control the carrier gas heater 105 and the upstream thermal device 120.

In operation, the control computer 200 may be programmed with an algorithm including receiving $T_{sublime}$, precursor material information and carrier gas information. The flow of the carrier gas may be adjusted to a desired value. The algorithm may measure the downstream temperature ($T_{downstream}$), calculate the vapor pressure $VP(T_{downstream})$ at $T_{downstream}$, and calculate a flow ratio (f) equal to $VP(T_{downstream})$/the vapor pressure $VP(T_{sublime})$. A nominal pressure ($P_{nominal}$) may be received from the CVD tool controller 230, a user, or other source. The algorithm may send a control signal to the pressure controller 220 to adjust the sublimation vessel pressure to a value equal to the flow ratio (f) times $P_{nominal}$. The algorithm may calculate $\Delta T$ from $VP(T_{downstream})$, the sublimation vessel pressure, heat of sublimation and $c_p$ of the carrier gas using equation 1. The algorithm may add or subtract energy to the carrier gas (e.g., via the carrier gas heater 105 and/or the upstream thermal device 120) to be equal to $T_{downstream}+\Delta T$ in the area around the upstream temperature sensor 130. The algorithm may iteratively adjust the upstream temperature to $T_{downstream}+\Delta T$ based on input from the upstream and downstream temperature sensors 130, 160.

Figure 9A:
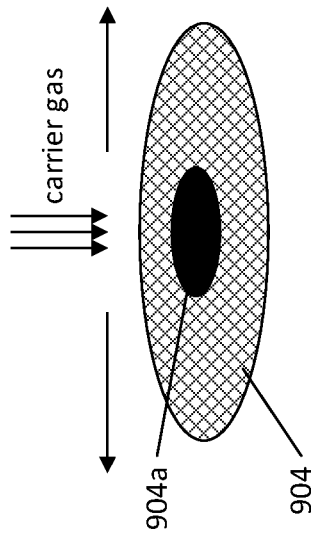
FIGS. 9A-9D are examples of turbulator elements.
Figure 9B:
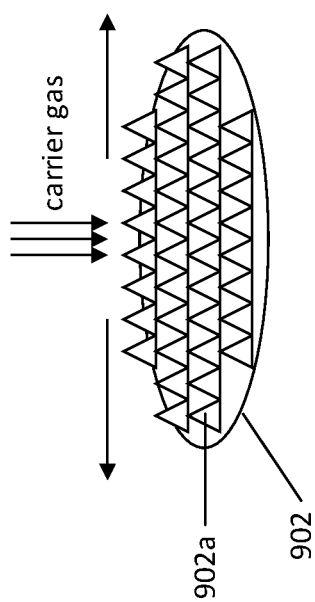
Figure 9D:
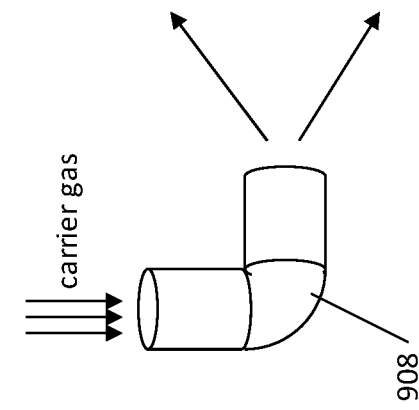
Figure 9C:
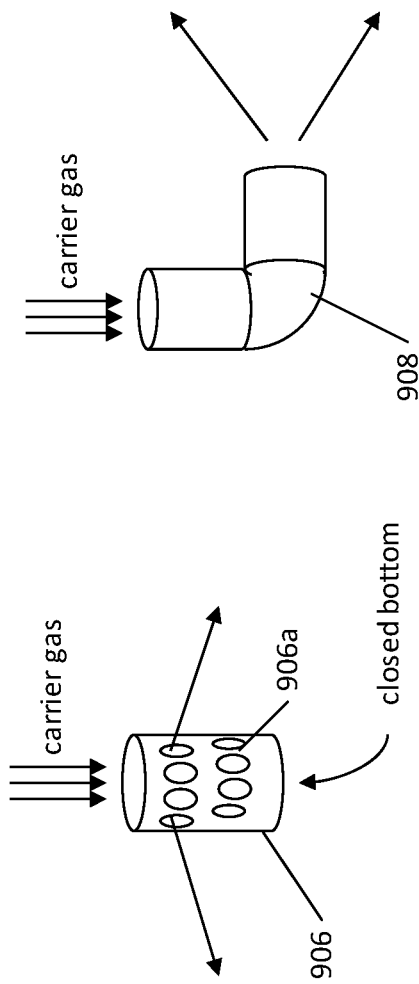

Referring to FIGS. 9A-9D, examples of deflectors/turbulators 110 are shown. In general, the deflector/turbulator 110 are designed to spread the flow of the incoming jet of carrier gas over the precursor bed 150. The deflector/turbulator 110 are configured to assist in providing a uniform temperature of carrier gas above the upstream surface of the precursor bed 150. For example, the deflector/turbulator 110 may be configured to reduce the formation of stationary currents of the carrier gas with different temperatures. Various designs of example deflector/turbulator 110 are shown in FIGS. 9A-9D. FIG. 9A is a plate 902 made from an appropriate material such as stainless steel (but other suitable material such as ceramics, plastic, or glass may be used). A round plate is shown as an example, but the plate 902 may be in the shape of any polygon or an irregular in shape. The upper surface of the plate 902 may be roughened with a plurality of structures 902a. In an example, each of the structures may be 0.1 mm to 5 mm in size and extend outward from the plate. In an example, the plate 902 may be manufactured by piercing a sheet of material from the bottom with a triangular pyramidal punch. This process creates triangular tabs that rise at an angle up from the sheet. In an example, the area of the turbulator plate that is adjacent to the carrier gas inlet may not pierced. The diameter of the non-pierced center may be as small as the opening of the carrier gas inlet and may be as large as the disc itself. FIG. 9B is a turbulator 904 constructed from wire mesh. The pitch of the mesh may be between 0.1 mm and 5 mm. A spot that is adjacent to where the carrier gas emerges may be covered by a plate 904a may be as small as the diameter of the carrier gas port or it may stretch towards edge of the mesh. FIG. 9C is a turbulator 906 comprising a tube which has holes in the side walls. In an example, the diameter of the holes may be between 0.1 mm and 5 mm. One end of the tube is closed the other end is connected to the carrier gas inlet port. In an example, the turbulator 906 may comprise sintered material configured to disperse the carrier gas flowing into the tube. FIG. 9D is a turbulator 908 that is a 90 degree elbow.

Figure 10:
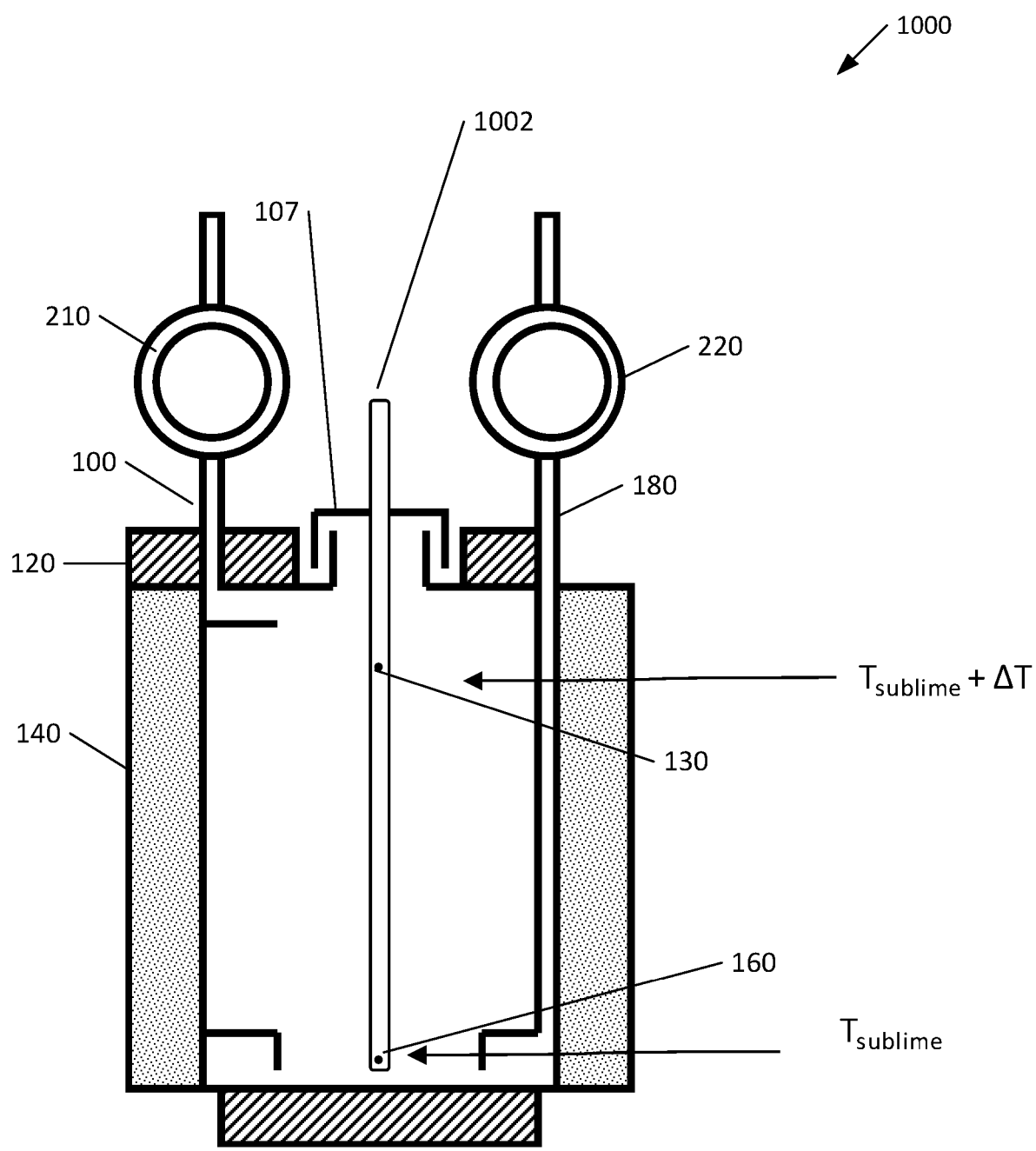
FIG. 10 is a schematic diagram of an example precursor vapor source with a temperature sensing tube.

Referring to FIG. 10, with further reference to FIGS. 3 and 6, a schematic diagram of an example of a sublimation vessel (e.g., bubbler) 1000 for a precursor vapor source with a temperature sensing tube 1002 is shown. The precursor vapor source in FIG. 10 is similar the precursor vapor sources described in FIGS. 3 and 6 with the addition of the temperature sensing tube 1002. The temperature sensing tube 1002 may include the upstream temperature sensor 130 and the downstream temperature sensor 160 as previously described. The temperature sensing tube 1002 may also include a multitude of temperature sensors between the upstream temperature sensor 130 and the downstream temperature sensor 160. The cap 107 may be configured to accommodate the temperature sensing tube 1002 when the cap 107 is removed (i.e., the cap 107 may be removed independently of the temperature sensing tube 1002). In an example, the temperature sensing tube 1002 may be affixed to the cap 107 and the two components may be remove together. In addition the sublimation vessel 1000 may be constructed so that the top or lid is attached via a flange and can be removed to gain full access to the interior of the vessel (e.g., bubbler).

Figure 11:
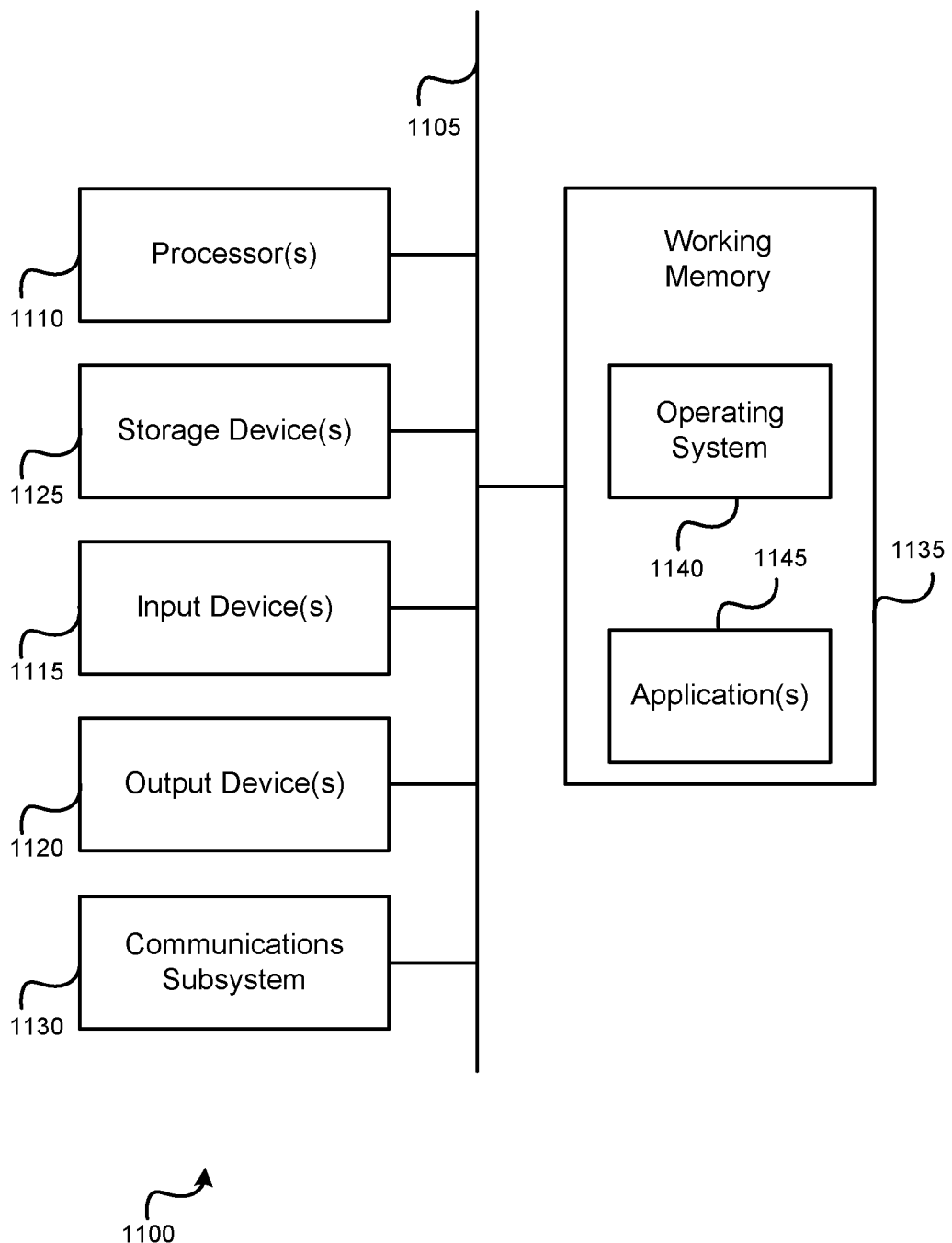
FIG. 11 illustrates a block diagram of an example of a computer system.

A computer system as illustrated in FIG. 11 incorporate as part of the previously described computerized devices such as the control computer 200 and the CVD tool controller. FIG. 11 provides a schematic illustration of one embodiment of a computer system 2200 that can perform the methods, process and algorithms provided by various other embodiments, as described herein. It should be noted that FIG. 11 is meant only to provide a generalized illustration of various components, any or all of which may be utilized as appropriate. FIG. 11, therefore, broadly illustrates how individual system elements may be implemented in a relatively separated or relatively more integrated manner.

The computer system 1100 is shown comprising hardware elements that can be electrically coupled via a bus 1105 (or may otherwise be in communication, as appropriate). The hardware elements may include one or more processors 1110, including without limitation one or more general-purpose processors and/or one or more special-purpose processors (such as digital signal processing chips, graphics acceleration processors, and/or the like); one or more input devices 1115, which can include without limitation a mouse, a keyboard and/or the like; and one or more output devices 1120, which can include without limitation a display device, a printer and/or the like.

The computer system 1100 may further include (and/or be in communication with) one or more non-transitory storage devices 1125, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The computer system 1100 might also include a communications subsystem 1130, which can include without limitation a modem, a network card (wireless or wired), an infrared communication device, a wireless communication device and/or chipset (such as a Bluetooth device, an 802.11 device, a WiFi device, a WiMax device, cellular communication facilities, etc.), and/or the like. The communications subsystem 1130 may permit data to be exchanged with a network (such as the network described below, to name one example), other computer systems, and/or any other devices described herein. In many embodiments, the computer system 1100 will further comprise a working memory 1135, which can include a RAM or ROM device, as described above.

The computer system 1100 also can comprise software elements, shown as being currently located within the working memory 1135, including an operating system 1140, device drivers, executable libraries, and/or other code, such as one or more application programs 1145, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 1125 described above. In some cases, the storage medium might be incorporated within a computer system, such as the computer system 1100. In other embodiments, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the computer system 1100 and/or might take the form of source and/or installable code, which, upon compilation and/or installation on the computer system 1100 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer system (such as the computer system 1100) to perform methods in accordance with various embodiments of the invention. According to a set of embodiments, some or all of the procedures of such methods are performed by the computer system 1100 in response to processor 1110 executing one or more sequences of one or more instructions (which might be incorporated into the operating system 1140 and/or other code, such as an application program 1145) contained in the working memory 1135. Such instructions may be read into the working memory 1135 from another computer-readable medium, such as one or more of the storage device(s) 1125. Merely by way of example, execution of the sequences of instructions contained in the working memory 1135 might cause the processor(s) 1110 to perform one or more procedures of the methods described herein.

The terms "machine-readable medium" and "computer-readable medium," as used herein, refer to any medium that participates in providing data that causes a machine to operate in a specific fashion. In an embodiment implemented using the computer system 1100, various computer-readable media might be involved in providing instructions/code to processor(s) 1110 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 1125. Volatile media include, without limitation, dynamic memory, such as the working memory 1135. Transmission media include, without limitation, coaxial cables, copper wire and fiber optics, including the wires that comprise the bus 1105, as well as the various components of the communications subsystem 1130 (and/or the media by which the communications subsystem 1130 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 1110 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1100. These signals, which might be in the form of electromagnetic signals, acoustic signals, optical signals and/or the like, are all examples of carrier waves on which instructions can be encoded, in accordance with various embodiments of the invention.

The communications subsystem 1130 (and/or components thereof) generally will receive the signals, and the bus 1105 then might carry the signals (and/or the data, instructions, etc. carried by the signals) to the working memory 1135, from which the processor(s) 1105 retrieves and executes the instructions. The instructions received by the working memory 1135 may optionally be stored on a storage device 1125 either before or after execution by the processor(s) 1110.

Other examples and implementations are within the scope and spirit of the disclosure and appended claims. For example, due to the nature of software and computers, functions described above can be implemented using software executed by a processor, hardware, firmware, hardwiring, or a combination of any of these. Features implementing functions may also be physically located at various positions, including being distributed such that portions of functions are implemented at different physical locations.

Also, as used herein, "or" as used in a list of items prefaced by "at least one of" or prefaced by "one or more of" indicates a disjunctive list such that, for example, a list of "at least one of A, B, or C," or a list of "one or more of A, B, or C," or "A, B, or C, or a combination thereof" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, some operations may be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform one or more of the described tasks.

Components, functional or otherwise, shown in the figures and/or discussed herein as being connected, coupled (e.g., communicatively coupled), or communicating with each other are operably coupled. That is, they may be directly or indirectly, wired and/or wirelessly, connected to enable signal transmission between them.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

"About" and/or "approximately" as used herein when referring to a measurable value such as an amount, a temporal duration, and the like, encompasses variations of ±20% or ±10%, ±5%, or +0.1% from the specified value, as appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as appropriate in the context of the systems, devices, circuits, methods, and other implementations described herein.

Further, more than one invention may be disclosed.

The invention claimed is:

1. An apparatus, comprising:
a sublimation vessel containing a solid precursor material;
a carrier gas heater configured to control a temperature of a carrier gas entering the sublimation vessel;
a first temperature sensor configured to measure a temperature of the carrier gas entering the sublimation vessel;
a second temperature sensor configured to measure a temperature of a vapor exiting the sublimation vessel; and
a controller communicatively coupled to the carrier gas heater, the first temperature sensor, and the second temperature sensor, and configured to:
compute a delta temperature value based on a vapor pressure of the solid precursor material at a sublimation temperature, a sublimation vessel pressure value, a heat of sublimation value for the solid precursor material, and a specific heat of the carrier gas at a constant pressure; and
control the temperature of the carrier gas with the carrier gas heater based on the temperature of the vapor exiting the sublimation vessel and the delta temperature value, wherein the carrier gas temperature is controlled such that the temperature of the carrier gas entering the sublimation vessel is equal to the temperature of the vapor exiting the sublimation vessel plus the delta temperature value.

2. The apparatus of claim 1, further comprising a pressure controller communicatively coupled to the controller, wherein the controller is configured to set the sublimation vessel pressure value inside the sublimation vessel with the pressure controller.

3. The apparatus of claim 1, further comprising a mass flow controller communicatively coupled to the controller, wherein the controller is configured to set a flow rate of the carrier gas into the sublimation vessel with the mass flow controller.

4. The apparatus of claim 1, further comprising one or more deflectors configured to shape a flow of the carrier gas in the sublimation vessel to create a uniform flow velocity of the carrier gas normal to an upstream surface of the solid precursor material.

5. The apparatus of claim 1, wherein the sublimation vessel pressure value is 225 torr.

6. The apparatus of claim 1, further comprising a thermally isolating shroud disposed around at least a portion of the sublimation vessel.

7. An apparatus for controlling a solid precursor vapor source, comprising:
- means for providing a carrier gas to a sublimation vessel containing a solid precursor material, wherein a temperature of the carrier gas is controlled with a carrier gas temperature control device prior to entering the sublimation vessel;
- means for measuring the temperature of the carrier gas entering the sublimation vessel;
- means for measuring a temperature of a vapor exiting the sublimation vessel;
- means for computing a delta temperature value based on a vapor pressure of the solid precursor material at a sublimation temperature, a sublimation vessel pressure value, a heat of sublimation value for the solid precursor material, and a specific heat of the carrier gas at a constant pressure; and
- means for controlling the temperature of the carrier gas with the carrier gas temperature control device based on the temperature of the vapor exiting the sublimation vessel and the delta temperature value, wherein the carrier gas temperature is controlled such that the temperature of the carrier gas entering the sublimation vessel is equal to the temperature of the vapor exiting the sublimation vessel plus the delta temperature value.

8. The apparatus of claim 7, further comprising means for setting the pressure inside the sublimation vessel to the sublimation vessel pressure value.

9. The apparatus of claim 7, further comprising means for shaping a flow of the carrier gas in the sublimation vessel to spread the flow of the carrier gas over the solid precursor material.

10. The apparatus of claim 7, further comprising means for thermally isolating at least a portion of the sublimation vessel.

* * * * *